(12) United States Patent
Park et al.

(10) Patent No.: US 10,861,927 B2
(45) Date of Patent: Dec. 8, 2020

(54) ELECTRO-LUMINESCENT DISPLAY DEVICE WITH IMPROVED CONTACT STRUCTURE

(71) Applicant: LG Display Co., Ltd., Seoul (KR)

(72) Inventors: SangMoo Park, Goyang-si (KR); SeokHyun Lee, Seoul (KR); WonJune Jung, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 35 days.

(21) Appl. No.: 16/387,781

(22) Filed: Apr. 18, 2019

(65) Prior Publication Data

US 2019/0326382 A1 Oct. 24, 2019

(30) Foreign Application Priority Data

Apr. 19, 2018 (KR) .......................... 10-2018-0045697

(51) Int. Cl.
*H01L 27/32* (2006.01)

(52) U.S. Cl.
CPC ...... *H01L 27/3276* (2013.01); *H01L 27/3223* (2013.01); *H01L 27/3272* (2013.01); *H01L 2227/323* (2013.01)

(58) Field of Classification Search
None
See application file for complete search history.

(56) References Cited

U.S. PATENT DOCUMENTS

| 2013/0337596 | A1* | 12/2013 | Hung | H01L 51/56 438/34 |
| 2018/0026081 | A1* | 1/2018 | Lee | G02F 1/134309 349/46 |
| 2018/0033851 | A1* | 2/2018 | Kim | H01L 27/3258 |
| 2018/0330672 | A1* | 11/2018 | Park | G09G 3/3266 |
| 2019/0304356 | A1* | 10/2019 | Ka | H01L 27/3223 |

FOREIGN PATENT DOCUMENTS

KR 10-2015-0072118 A 6/2015

* cited by examiner

Primary Examiner — Steven M Christopher
(74) Attorney, Agent, or Firm — Polsinelli PC

(57) ABSTRACT

An electro-luminescent display device includes a data line disposed in a first direction on a substrate; a first insulating layer disposed on the data line; an active layer disposed on the first insulating layer; a gate line disposed above the first insulating layer in a second direction crossing the first direction to define a pixel region with the data line; a second insulating layer interposed between the first insulating layer and the gate line; a gate electrode disposed above the active layer and the second insulating layer interposed between the gate electrode and the active layer; a third insulating layer disposed on the gate electrode and the gate line; a source electrode and a drain electrode disposed on the third insulating layer and electrically connected to the active layer; a contact hole disposed between adjacent data lines of adjacent pixel regions and electrically connecting the source electrode and the data line, wherein the contact hole is formed by removing portions of the first insulating layer and the third insulating layer and has an area greater than a contact area between the source electrode and the data line; and a dummy pattern provided between the data lines of the adjacent pixel regions and including the active layer of a semiconductor layer and the first insulating layer.

23 Claims, 15 Drawing Sheets

ELECTRO-LUMINESCENT DISPLAY DEVICE WITH IMPROVED CONTACT STRUCTURE

CROSS-REFERENCE TO RELATED APPLICATION

This application claims the priority of Korean Patent Application No. 10-2018-0045697 filed on Apr. 19, 2018 in the Korean Intellectual Property Office, which is incorporated herein by reference in its entirety.

BACKGROUND

Field of the Disclosure

The present disclosure relates to a display device, and more particularly, to an electro-luminescent display device with an improved contact structure. Although the present disclosure is suitable for a wide scope of applications, it is particularly suitable for securing a high aperture ratio for a large-size and high-resolution display device and providing higher degrees of freedom in pixel design.

Description of the Background

As the information age advances, the field of display devices for visually displaying electrical information signals has grown rapidly. Accordingly, various studies on the display devices are ongoing to improve various aspects in thin profile, light weight and low power consumption.

Representative examples of the display devices include a liquid crystal display device (LCD), a field emission display device (FED), an electro-wetting display device (EWD), and an organic light emitting display device (OLED).

Particularly, electro-luminescent display devices including the OLED are self-light emitting display devices and do not need a separate light source unlike the LCD. Thus, the electro-luminescent display devices can be manufactured into a lightweight and thin profile. Further, the electro-luminescent display devices are advantageous in terms of power consumption since they are driven with a low voltage. Also, the electro-luminescent display devices have excellent color expression ability, a high response speed, a wide viewing angle, and a high contrast ratio (CR). Therefore, the electro-luminescent display devices are expected to be applied in various fields.

An electro-luminescent display device includes an emission layer formed of an organic material between two electrodes known as an anode and a cathode. When a hole from the anode and an electron from the cathode are injected into the emission layer, the injected hole and electron recombine into an exciton to emit light from the emission layer.

The emission layer contains a host material and a dopant material, and these two materials interact with each other. The host generates an exciton from an electron and a hole and transfers energy to the dopant. The dopant is an organic dye material contained in small amount and receives the energy from the host and converts the energy into light.

SUMMARY

Accordingly, the present disclosure is directed to an electro-luminescent display device with an improved contact structure that substantially obviates one or more of problems due to limitations and disadvantages of the prior art.

More specifically, to realize a large-size and high-resolution display device, a high aperture ratio needs to be secured. However, there has been a problem with a gate redundancy pattern for repairing short defects between horizontal lines such as gate lines and vertical lines such as data lines/power supply lines.

Accordingly, the present disclosure is to provide an electro-luminescent display device with an improved contact structure that can suppress the occurrence of short defects between vertical lines and horizontal lines without a gate redundancy pattern.

A conventional contact structure includes upper and lower layers (e.g., upper and lower electrodes) that cover a contact hole. In this structure, the size (or area) of the contact hole is the same as a contact or connection area between the upper and lower electrodes.

However, there has been a limitation on designing pixels due to the minimum size for patterning the contact hole. Further, overlay margins are needed between the lower electrode and the contact hole and between the upper electrode and the contact hole, respectively. Therefore, the degree of freedom for metal in designing pixels is inevitably decreased.

Further, if two contact holes are integrated into one to form a contact hole greater in size than the contact area, a residual photoresist layer caused by a step may be present between data lines exposed through the contact hole. Therefore, a defect such as a short circuit can occur.

Accordingly, the present disclosure is to provide an electro-luminescent display device with an improved contact structure that can suppress short defects when patterning an upper conductive layer and make it easy to design pixels for a high-resolution model.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

To achieve these and other advantages and in accordance with the the present disclosure, as embodied and broadly described, an electro-luminescent display device includes a data line disposed in a first direction on a substrate; a first insulating layer disposed on the data line; an active layer disposed on the first insulating layer; a gate line disposed above the first insulating layer in a second direction crossing the first direction to define a pixel region with the data line; a second insulating layer interposed between the first insulating layer and the gate line; a gate electrode disposed above the active layer and the second insulating layer interposed between the gate electrode and the active layer; a third insulating layer disposed on the gate electrode and the gate line; a source electrode and a drain electrode disposed on the third insulating layer and electrically connected to the active layer; a contact hole disposed between adjacent data lines of adjacent pixel regions and electrically connecting the source electrode and the data line, wherein the contact hole is formed by removing portions of the first insulating layer and the third insulating layer and has an area greater than a contact area between the source electrode and the data line; and a dummy pattern provided between the data lines of the adjacent pixel regions and including the active layer of a semiconductor layer and the first insulating layer.

In another aspect of the present disclosure, an electro-luminescent display device includes a data line and a gate line disposed intersecting each other on a substrate and defining a pixel region; a first insulating layer disposed on the data line; an active layer disposed on the first insulating layer; a gate electrode disposed above the active layer; a second insulating layer interposed between the active layer and the gate electrode; a third insulating layer disposed on the gate electrode and the gate line; a source electrode and a drain electrode disposed on the third insulating layer and electrically connected with the active layer; a contact hole provided between adjacent data lines of adjacent pixel regions and electrically connecting the source electrode and the data line since the first insulating layer and the third insulating layer are removed; and a dummy pattern provided between the adjacent data lines of the adjacent pixel regions, including the active layer of a semiconductor layer and the first insulating layer planarizing a step between the adjacent data lines of the adjacent pixel regions.

In another aspect of the present disclosure, an electro-luminescent display device includes a light shielding layer on a substrate; a data line disposed in a first direction on the substrate; a first insulating layer disposed on the data line; an active layer disposed on the first insulating layer; a gate line disposed above the first insulating layer in a second direction vertically crossing the first direction and defining a pixel region with the data line, wherein the gate line, the data line and the light shielding layer are disposed on a same plane of the substrate; a second insulating layer disposed on the gate line; a gate electrode disposed on the second insulating layer; a third insulating layer disposed on the gate electrode and the gate line; a source electrode and a drain electrode disposed on the third insulating layer and electrically connected to the active layer; and a contact hole disposed between adjacent data lines of adjacent pixel regions and electrically connecting the source electrode and the data line, wherein the contact hole has an area greater than a contact area between the source electrode and the data line.

In another aspect of the present disclosure, vertical lines such as data lines/power supply lines are disposed on the same layer as the lowermost light shielding layer and horizontal lines such as gate lines are disposed on the same layer as a gate electrode. Thus, it is possible to suppress the occurrence of short defects between the vertical lines and the horizontal lines. Therefore, it is possible to remove a gate redundancy pattern in a pixel. Accordingly, as for a high-resolution model, a production yield can be improved, and an additional aperture ratio can be secured.

In a further aspect of the present disclosure, two contact holes are integrated into one to form a contact hole greater in size (or area) than a contact area. Also, a dummy pattern including an active layer is formed at a step between data lines exposed by the contact hole. Therefore, it is possible to design pixels without a limitation on the size of the contact hole and remove the step between the data lines. Accordingly, the size of the contact hole can be increased, which makes it easy to apply a half-tone mask and thus can reduce masks. Further, the degree of freedom for metal in designing pixels is increased. Thus, it is possible to design pixels for a high-resolution model. Also, margins for electrodes are not needed, and, thus, an aperture ratio can be increased. Also, when an upper conductive layer is patterned, a residual photoresist layer caused by a step is not present between data lines. Thus, it is possible to suppress the occurrence of short defects.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
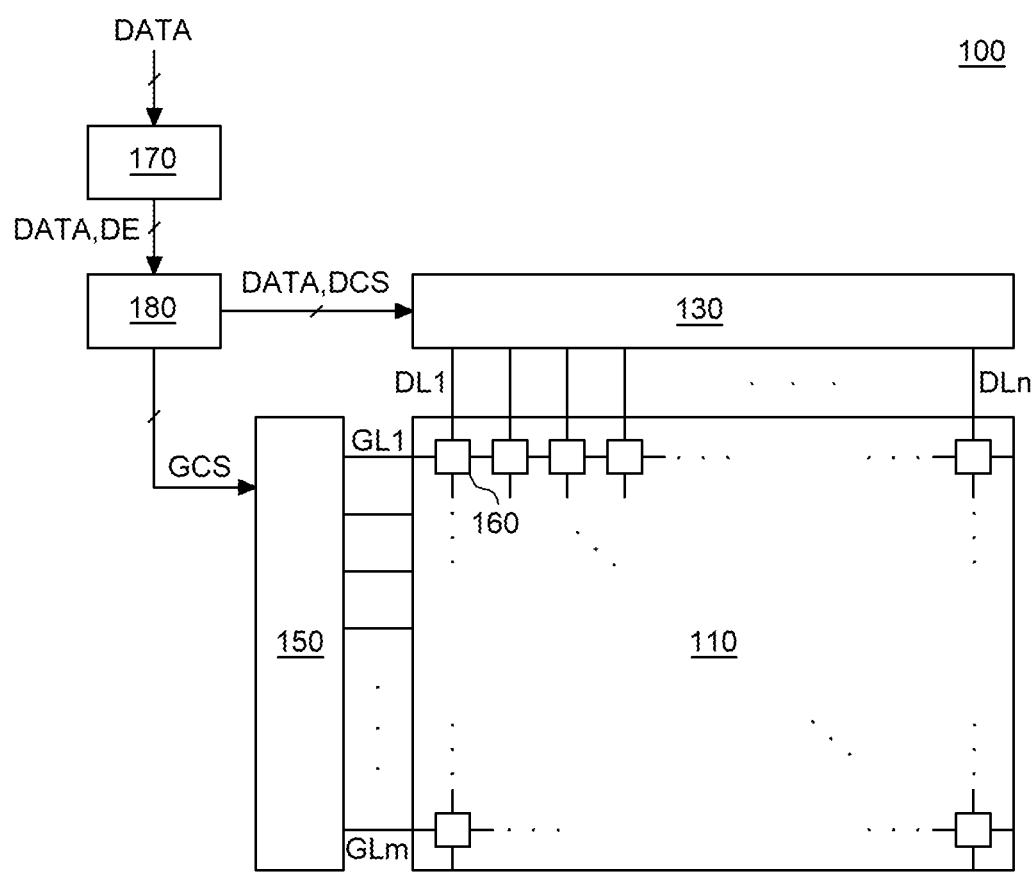
FIG. 1 is a block diagram schematically illustrating an electro-luminescent display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereafter, various aspects of the present disclosure will be described in detail with reference to the accompanying drawings.

FIG. 1 is a block diagram schematically illustrating an electro-luminescent display device according to an aspect of the present disclosure.

Referring to FIG. 1, an electro-luminescent display device 100 according to an aspect of the present disclosure may include a display panel 110 and a data drive integrated circuit (IC) 130. The electro-luminescent display device 100 may further include a gate drive IC 150, an image processor 170, and a timing controller 180.

The display panel 110 may include a plurality of sub-pixels 160. The plurality of sub-pixels 160 may be placed in a row direction and in a column direction and disposed in a matrix form. For example, as shown in FIG. 1, the plurality of sub-pixels 160 may be disposed in m number of rows and n number of columns. Hereinafter, among the plurality of sub-pixels 160, a group of sub-pixels 160 disposed in the row direction is defined as row sub-pixels and a group of sub-pixels 160 disposed in the column direction is defined as column sub-pixels for convenience of description.

Each of the plurality of sub-pixels 160 emits light of a specific color. For example, the plurality of sub-pixels 160 may include a red sub-pixel that emits red light, a green sub-pixel that emits green light, and a blue sub-pixel that emits blue light. In this case, a group of a red sub-pixel, a green sub-pixel and a blue sub-pixel may be referred to as a pixel.

The plurality of sub-pixels 160 in the display panel 110 may be connected to gate lines GL1 to GLm and data lines DL1 to DLn. For example, a first-row sub-pixel may be connected to a first gate line GL1 and a first column sub-pixel may be connected to a first data line DL1. Further, second to mth row sub-pixels may be connected respectively to second to mth gate lines GL2 to GLm. Also, second to nth column sub-pixels may be connected respectively to second to nth data lines DL2 to DLn. The plurality of sub-pixels 160 may be configured to operate based on a gate voltage transmitted from the gate lines GL1 to GLm and a data voltage transmitted from the data lines DL1 to DLn.

The image processor 170 may output a data signal (image data) DATA supplied from the outside and a data enable signal DE. The image processor 170 may output at least one of a vertical synchronization signal, a horizontal synchronization signal, and a clock signal in addition to the data enable signal DE.

The timing controller 180 may receive, from the image processor 170, various timing signals including the vertical synchronization signal, the horizontal synchronization signal, the data enable signal DE, and the clock signal together with the data signal DATA. The timing controller 180 may receive the data signal DATA, i.e., input image data, from the image processor 170. Then, the timing controller 180 may convert the data signal DATA in accordance with a data signal format which can be processed by the data drive IC 130 and output the data signal DATA, i.e., output image data. Besides, the timing controller 180 may receive timing signals such as the vertical synchronization signal, the horizontal synchronization signal, the data enable signal DE, and the clock signal. Then, the timing controller 180 may generate various control signals DCS and GCS and output the control signals DCS and GCS to the data drive IC 130 and the gate drive IC 150 to control the data drive IC 130 and the gate drive IC 150, respectively.

For example, the timing controller 180 may output various gate control signals GCS including a gate start pulse GSP, a gate shift clock GSC, a gate output enable GOE, etc. to control the gate drive IC 150.

Herein, the gate start pulse controls an operation start timing of one or more gate circuits included in the gate drive IC 150. The gate shift clock is a clock signal which is commonly input to one or more gate circuits and controls a shift timing of a scan signal (i.e., gate pulse). The gate output enable signal designates timing information of one or more gate circuits.

The timing controller 180 may also output various data control signals DCS including a source start pulse SSP, a source sampling clock SSC, a source output enable SOE, etc. to control the data drive IC 130.

Herein, the source start pulse controls a data sampling start timing of one or more data circuits included in the data drive IC 130. The source sampling clock is a clock signal which controls a sampling timing of data in each data circuit. The source output enable signal controls an output timing of the data drive IC 130.

The gate drive IC 150 may sequentially supply a scan signal which is an on-voltage or off-voltage to the gate lines GL1 to GLm to sequentially drive gate lines GL1 to GLm under the control of the timing controller 180.

According to a drive method, the gate drive IC 150 may be located only at one side of the display panel 110 or located at both sides thereof if necessary.

The gate drive IC 150 may be connected to a bonding pad of the display panel 110 by means of a tape automated bonding (TAB) method or a chip on glass (COG) method. The gate drive IC 150 may be implemented to be a gate in panel (GIP) type to be directly disposed in the display panel 110. Otherwise, the gate drive IC 150 may be integrated to be disposed in the display panel 110 if necessary.

The gate drive IC 150 may include a shift register, a level shifter, or the like.

When a specific gate line GL1 to GLm is opened, the data drive IC 130 may convert the output image data DATA received from the timing controller 180 into an analog data voltage. Then, the data drive IC 130 may output the analog data voltage to the data lines DL1 to DLn to drive the data lines DL1 to DLn.

The data drive IC 130 may be connected to the bonding pad of the display panel 110 by means of a tape automated bonding (TAB) method or a chip on glass (COG) method. The data drive IC 130 may be directly disposed in the display panel 110 or may be integrated to be disposed in the display panel 110 if necessary.

The data drive IC 130 may be implemented by a chip on film (COF) method. In this case, one end of the data drive IC 130 may be bonded to at least one source printed circuit board and the other end may be bonded to the display panel 110.

The data drive IC 130 may include a logic unit including various circuits such as a level shifter or a latch unit, a digital analog converter DAC, and an output buffer.

The structure of the pixel 160 will be described in detail with reference to FIG. 2 and FIG. 3.

Figure 2:
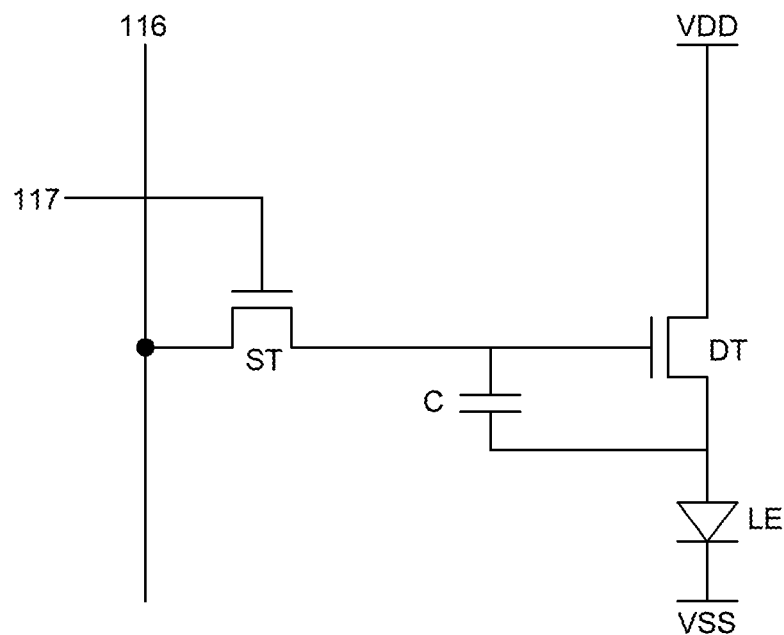
FIG. 2 is a circuit diagram of a pixel included in the electro-luminescent display device according to an aspect of the present disclosure.

FIG. 2 is a circuit diagram of a pixel included in the electro-luminescent display device according to an aspect of the present disclosure. Hereinafter, for convenience of description, an electro-luminescent display device including a 2T(Transistor)1C(Capacitor) structure is illustrated. In this case, a pixel structure and its operation will be described. However, the present disclosure is not limited thereto.

Referring to FIG. 2, in the electro-luminescent display device 100 according to an aspect of the present disclosure, a pixel may include a switching transistor ST, a drive transistor DT, a compensation circuit (not illustrated), and a light emitting device LE.

The light emitting device LE may operate to emit light according to a driving current formed by the drive transistor DT.

The switching transistor ST may perform a switch operation, so that a data signal supplied through a data line 116 in response to a gate signal supplied through a gate line 117 is stored as a data voltage in a capacitor C.

The drive transistor DT may operate to allow a constant driving current to flow between a high-potential power supply line VDD and a low-potential power supply line VSS in response to the data voltage stored in the capacitor C.

Herein, the compensation circuit is configured to compensate for a threshold voltage of the drive transistor DT and may include one or more transistors and capacitors. The compensation circuit may have various configurations depending on a compensation method.

As described above, in the electro-luminescent display device 100 according to an aspect of the present disclosure, a pixel has a 2T1C structure including the switching transistor ST, the drive transistor DT, the capacitor C, and the light emitting device LE. However, when the compensation circuit is added to the pixel, the pixel may have various configurations such as 3T1C, 4T2C, 5T2C, 6T1C, 6T2C, 7T1C, and 7T2C, or the like.

Figure 3:
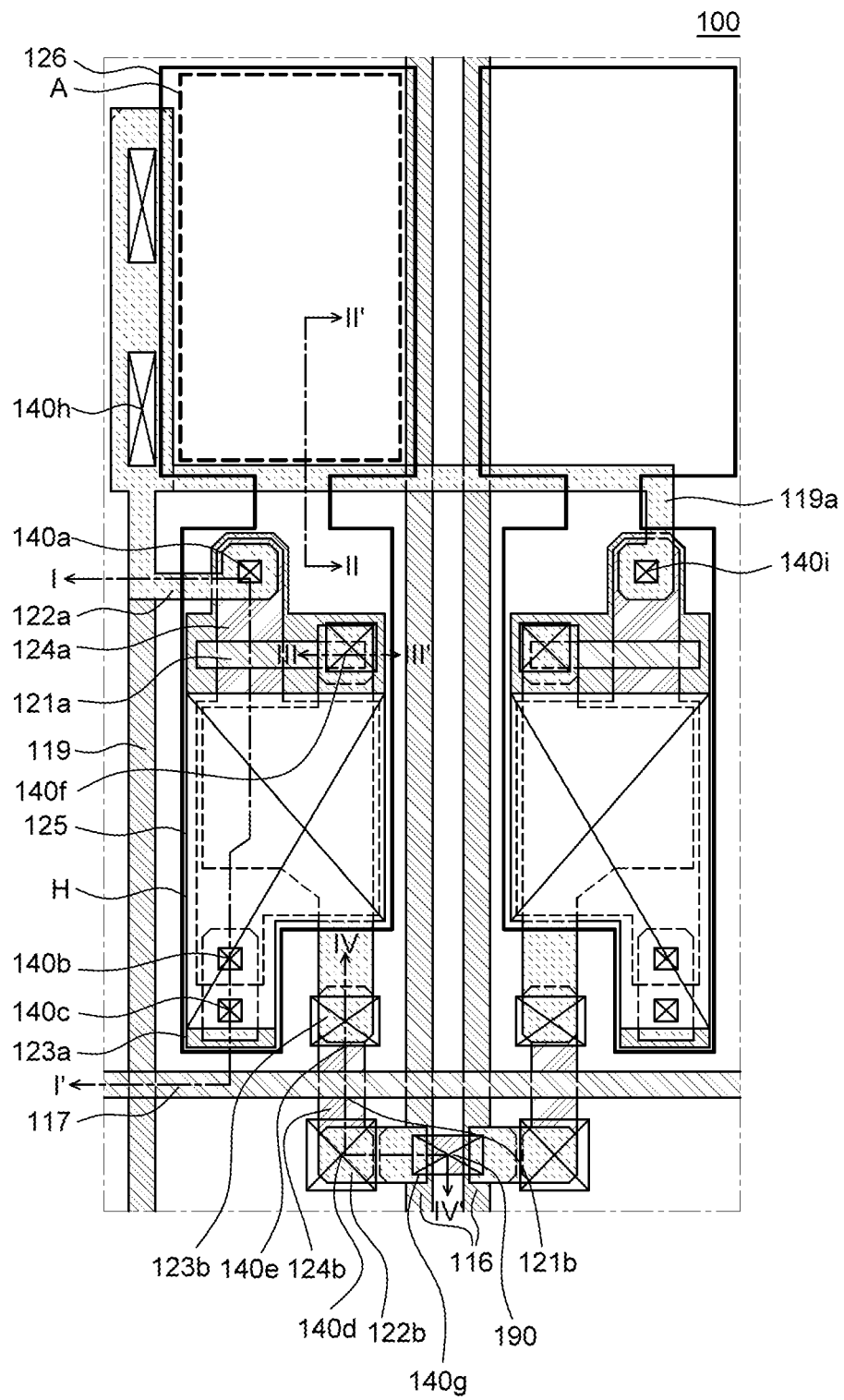
FIG. 3 is a plan view schematically illustrating the electro-luminescent display device according to an aspect of the present disclosure.
Figure 4:
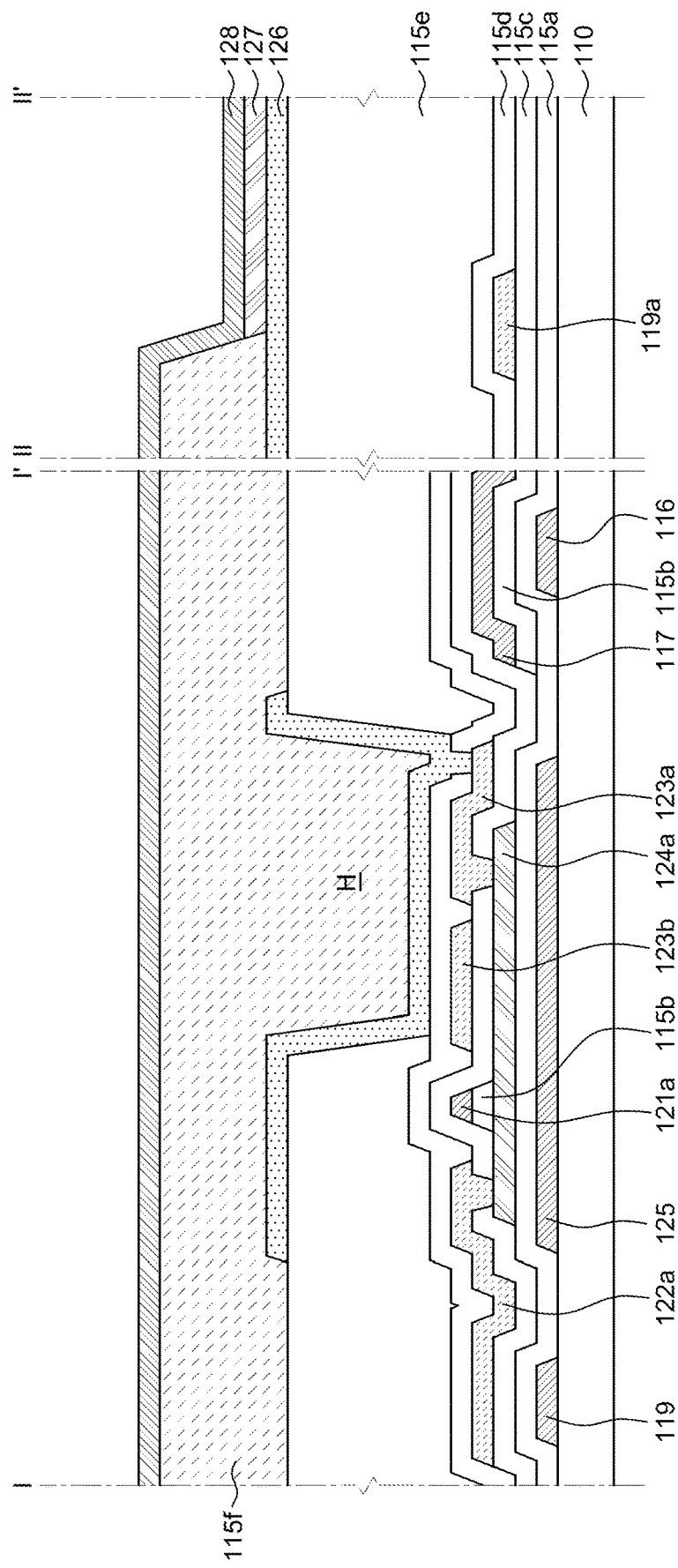
FIG. 4 through FIG. 6 are schematic cross-sectional views of the electro-luminescent display device illustrated in FIG. 3 according to an aspect of the present disclosure.
Figure 5:
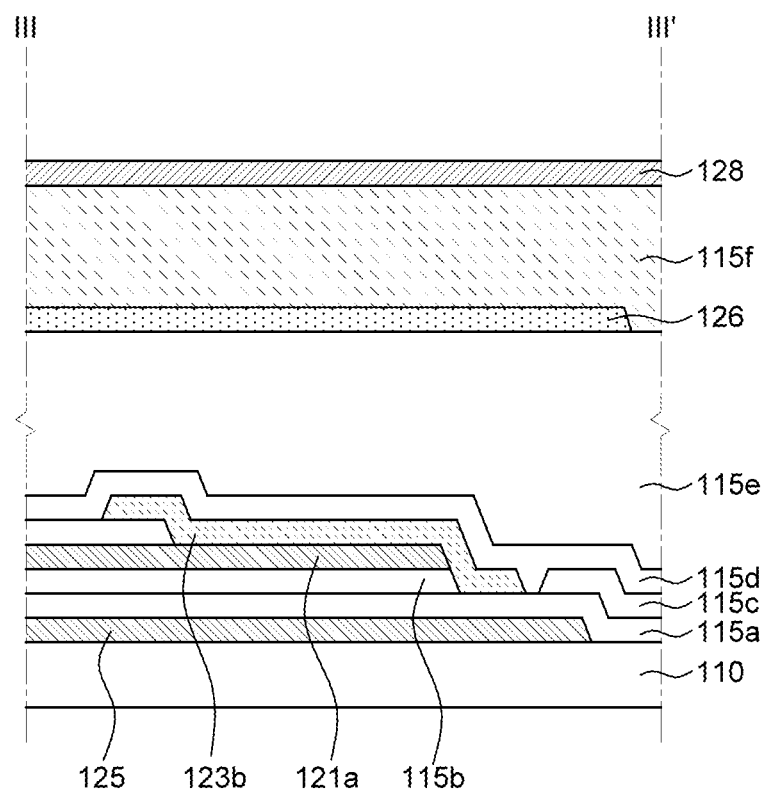
Figure 6:
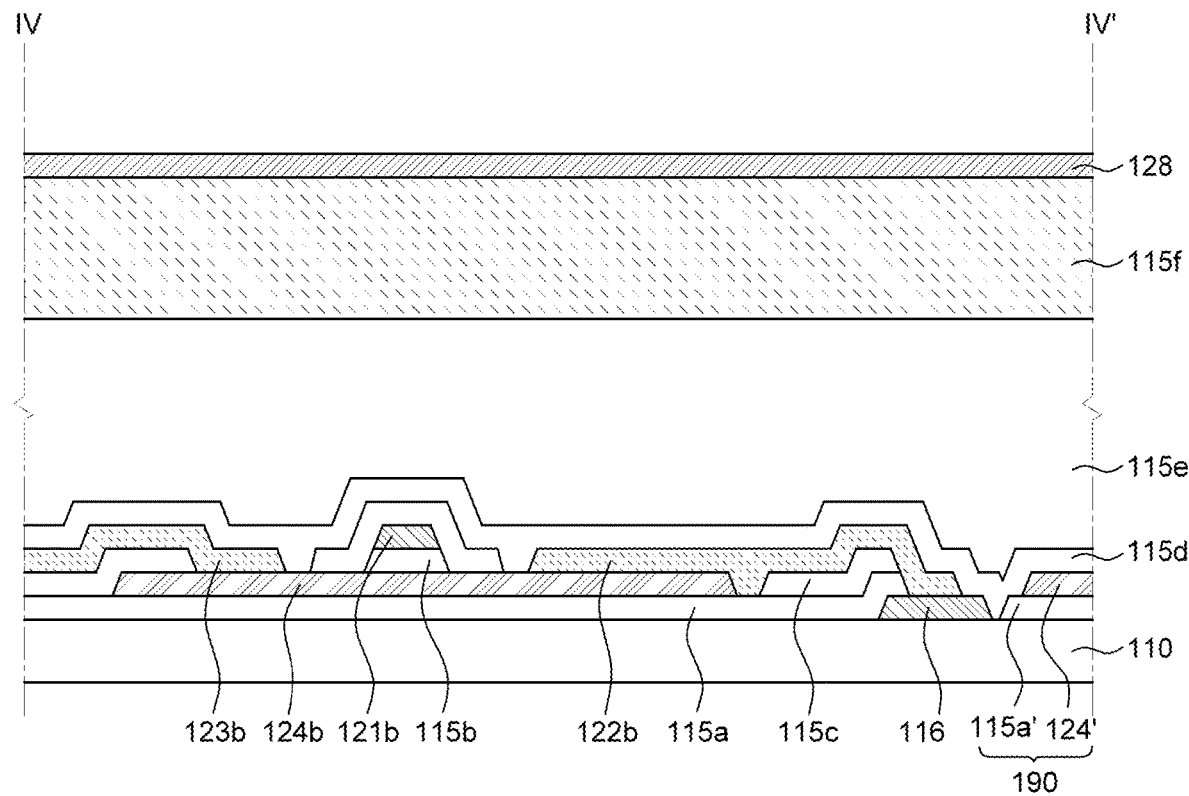

FIG. 3 is a plan view schematically illustrating the electro-luminescent display device according to an aspect of the present disclosure. FIG. 4 through FIG. 6 are schematic cross-sectional views of the electro-luminescent display device illustrated in FIG. 3 according to an aspect of the present disclosure.

FIG. 3 schematically illustrates a planar structure of two adjacent pixels in the electro-luminescent display device 100 according to an aspect of the present disclosure. For convenience of description, FIG. 3 shows an example where a pixel has a 2T1C structure including a switching transistor, a drive transistor, a capacitor, and a light emitting device. However, as described above, when the compensation circuit is added to the pixel, the pixel may have various configurations such as 3T1C, 4T2C, 5T2C, 6T1C, 6T2C, 7T1C, and 7T2C, or the like.

FIG. 4 through FIG. 6 are schematic cross-sectional views of the electro-luminescent display device 100 according to an aspect of the present disclosure as taken along lines I-I', II-II', III-III', and IV-IV', respectively, of FIG. 3. FIG. 4 is an exemplary depiction of a part of a circuit unit including a drive transistor and a capacitor, a part of a light emitting unit including a light emitting device, and a part of an intersection portion between the gate line 117 and the data line 116. FIG. 5 is an exemplary depiction of a part of the circuit unit where a first gate electrode 121a of the drive transistor and a second drain electrode 123b of the switching transistor are connected. FIG. 6 is an exemplary depiction of a part of the circuit unit where the data line 116 and a second source electrode 122b of the switching transistor are connected.

Herein, FIG. 3 shows an example where a contact structure according to an aspect of the present disclosure is applied to a part (shown in FIG. 7A and FIG. 7B) of the electro-luminescent display device 100. However, the present disclosure is not limited thereto. The contact structure of the present disclosure will be described later.

Referring to FIG. 3 through FIG. 6, in the electro-luminescent display device 100 according to an aspect of the present disclosure, the gate line (or scan line) 117, the data line 116, and a power supply line (or power voltage line) 119 intersect each other on the substrate 110 to define a pixel region. A sensing control line, a reference line, or the like may be further disposed thereon.

The data line 116 and the power supply line 119 may be disposed on the substrate 110 in a first direction. Further, the gate line 117 may be disposed in a second direction crossing the first direction to define a pixel region together with the data line 116 and the power supply line 119. Herein, for convenience of description, a pixel region may be divided into a light emitting unit where a light emitting device emits light and a circuit unit including a plurality of drive circuits which supplies a driving current to the light emitting device.

The power supply line 119 may be disposed for at least every one pixel region, but the present disclosure is not limited thereto.

Further, in addition to the data line 116 and the power supply line 119, the reference line may also be disposed in the first direction on the same layer as the data line 116 and the power supply line 119.

Each of a plurality of pixel regions may include a red sub-pixel region, a green sub-pixel region, a blue sub-pixel region and a white sub-pixel region to form a unit pixel. FIG. 3 illustrates only two of those sub-pixel regions as an example, but the present disclosure is not limited thereto. Each of the red, green, blue and white sub-pixel regions includes a light emitting device and a plurality of pixel drive circuits that independently drives the light emitting device. A pixel drive circuit may include a switching transistor, a drive transistor, a capacitor, and a sensing transistor.

When a scan pulse is supplied to the gate line 117, the switching transistor may be turned on to supply a data signal supplied to the data line 116 to the capacitor and the first gate electrode 121a of the drive transistor. The switching transistor may include a second gate electrode 121b connected to the gate line 117 and a second source electrode 122b connected to the data line 116 through a seventh contact hole 140g. The switching transistor may further include the second drain electrode 123b connected to the first gate electrode 121a through a sixth contact hole 140f and a second active layer 124b.

The drive transistor may control a current supplied from the power supply line 119 according to a driving voltage charged in the capacitor and supply the current in proportion to the driving voltage to the light emitting device. Thus, the drive transistor enables the light emitting device to emit light. The drive transistor may include the first gate electrode 121a connected to the second drain electrode 123b through the sixth contact hole 140f and a first source electrode 122a connected to the power supply line 119 through an eighth contact hole 140h. The drive transistor may further include a first drain electrode 123a connected to the light emitting device through a third contact hole 140c and a hole H and a first active layer 124a.

The power supply line 119 may be connected to the first source electrode 122a of an adjacent pixel region through a bridge line 119a. The bridge line 119a may be extended to the adjacent pixel region in a direction parallel to the second direction. The bridge line 119a extended to the adjacent pixel region may be connected to the first source electrode 122a of the adjacent pixel region through a ninth contact hole 140i.

One side of the bridge line 119a may be extended vertically along the power supply line 119 and connected through the eighth contact hole 140h to the power supply line 119 under the eighth contact hole 140h.

Herein, the thin film transistors illustrated in FIG. 4 and FIG. 6 are drive transistors and switching transistors. The thin film transistors are illustrated as having a top-gate structure, particularly a coplanar structure, in which the first gate electrode 121a and the second gate electrode 121b are disposed on the first active layer 124a and the second active layer 124b, respectively. However, the present disclosure is not limited thereto. The thin film transistors may have a bottom-gate structure in which a gate electrode is disposed under an active layer.

The first and second gate electrodes 121a and 121b of the switching transistor and the drive transistor may overlap the first and second active layers 124a and 124b, respectively, via a gate insulating layer 115b. The gate insulating layer 115b has substantially the same shape as each of the first and second gate electrodes 121a and 121b.

Specifically, the first and second active layers 124a and 124b may be disposed on the substrate 110.

Herein, a light shielding layer 125 may be disposed under the first active layer 124a and a buffer layer 115a may be disposed between the first active layer 124a and the light shielding layer 125.

The light shielding layer 125 may function to block the effect of light from the outside or neighboring light emitting devices on the first active layer 124a and may be disposed as the lowermost layer on the substrate 110.

The data line 116 and the power supply line 119 of the present disclosure may be disposed in the first direction on the same layer as the light shielding layer 125. That is, the data line 116 and the power supply line 119 of the present disclosure as well as the light shielding layer 125 are disposed as the lowermost layer on the substrate 110. Accordingly, vertical lines including the data line 116 and the power supply line 119 are disposed on a layer different from that in the conventional case. Therefore, instead of an interlayer insulating layer 115c, other insulating layers (e.g., the buffer layer 115a and the gate insulating layer 115b) are disposed between the vertical lines including the data line 116 and the power supply line 119 and a horizontal line including the gate line 117. This is to suppress a short defect.

The buffer layer 115a may be disposed on the substrate 110 to cover the light shielding layer 125, the data line 116 and the power supply line 119.

The first and second active layers 124a and 124b are formed to overlap the first and second gate electrodes 121a and 121b, respectively, on the gate insulating layer 115b. Thus, channels may be formed between the first source electrode 122a and the first drain electrode 123a and between the second source electrode 122b and the second drain electrode 123b, respectively.

The gate insulating layer 115b may be formed of a single layer of an inorganic material such as silicon nitride ($SiN_x$) or silicon oxide ($SiO_x$) or a multilayer of silicon nitride ($SiN_x$) or silicon oxide ($SiO_x$).

FIG. 4 through FIG. 6 illustrate an example where the gate insulating layer 115b is formed only under the first gate electrode 121a and the second gate electrode 121b, but the present disclosure is not limited thereto. The gate insulating layer 115b of the present disclosure may be formed on the entire substrate 110 on which the first and second active layers 124a and 124b have been formed. In this case, the gate insulating layer 115b may include contact holes to allow the first source electrode 122a and the first drain electrode 123a to be connected respectively to a source region and a drain region of the first active layer 124a. Further, the gate insulating layer 115b may include contact holes to allow the second source electrode 122b and the second drain electrode 123b to be connected respectively to a source region and a drain region of the second active layer 124b.

The gate line 117 may be disposed on the same layer as the first and second gate electrodes 121a and 121b. The above-described gate insulating layer 115b may be disposed under the gate line 117. However, the present disclosure is not limited thereto.

The first and second gate electrodes 121a and 121b and the gate line 117 may be formed of any one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

The first and second active layers 124a and 124b may be formed of an oxide semiconductor containing at least one metal of Zn, Cd, Ga, In, Sn, Hf, and Zr, amorphous silicon (a-Si), polycrystalline silicon (poly-Si), or an organic semiconductor.

The first and second source electrodes 122a and 122b may be connected to source regions of the first and second active layers 124a and 124b through first and fourth contact holes 140a and 140d, respectively, penetrating the interlayer insulating layer 115c. The first and second drain electrodes 123a and 123b may be connected to drain regions of the first and second active layers 124a and 124b through second and fifth contact holes 140b and 140e, respectively, penetrating the interlayer insulating layer 115c.

The interlayer insulating layer 115c may be formed of a single layer of an inorganic material such as silicon nitride ($SiN_x$), silicon oxide ($SiO_x$), a multilayer of silicon nitride ($SiN_x$), and silicon oxide ($SiO_x$). The interlayer insulating layer 115c may be formed on the entire substrate 110 as shown in FIG. 4 through FIG. 6 or only on the pixel region, but the present disclosure is not limited thereto.

The first and second source electrodes 122a and 122b and the first and second drain electrodes 123a and 123b may be formed of one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

The second drain electrode 123b of the switching transistor may be extended in one direction to be electrically connected with the first gate electrode 121a of the drive transistor. Specifically, the second drain electrode 123b may be connected with the first gate electrode 121a through the sixth contact hole 140f penetrating the interlayer insulating layer 115c.

The first drain electrode 123a may be connected to an anode 126 of the light emitting device through the third contact hole 140c and the hole H penetrating a protection layer 115d and an overcoating layer 115e.

As described above, in the electro-luminescent display device 100 according to an aspect of the present disclosure, the vertical lines including the data line 116 and the power supply line 119 are disposed on the substrate 110 in the first direction. Further, the horizontal line including the gate line 117 is disposed in the second direction crossing the first direction and thus defines the pixel region together with the vertical lines.

Particularly, in the electro-luminescent display device 100 according to an aspect of the present disclosure, the vertical lines including the data line 116 and the power supply line 119 are disposed on the same layer as the light shielding layer 125 which is the lowermost layer. Further, the horizontal line including the gate line 117 is disposed on the same layer as the first and second gate electrodes 121a and 121b. Therefore, instead of the interlayer insulating layer 115c which has been conventionally used, two layers including the gate insulating layer 115b and the buffer layer 115a may be interposed between the vertical lines and the horizontal line. In this case, the gate insulating layer 115b and the buffer layer 115a are irrelevant to the capacity of the capacitor. Thus, the thickness of the gate insulating layer 115b and/or the buffer layer 115a can be increased. Accordingly, as a distance between the vertical lines and the horizontal line increases, the occurrence of short circuits at intersections between the vertical lines and the horizontal line can be suppressed.

In the conventional case, short circuits may occur between a horizontal line including a gate line and vertical lines including a data line and a power supply line. Therefore, a gate redundancy pattern needs to be formed to repair the short circuits. This is because the horizontal line and the vertical lines intersect each other only with an interlayer insulating layer interposed therebetween and thus have a small distance from each other. Accordingly, a defect associated with static electricity, a short circuit caused by foreign materials between the horizontal line and the vertical lines, or a defect caused by an insulating layer on the gate line may occur. Further, a structure for repair needs to be designed within a pixel to improve a production yield. For this reason, conventionally, the gate redundancy pattern has been applied at intersections between the horizontal line and the vertical lines. The gate redundancy pattern is formed to occupy a predetermined area above and under the gate line, which has caused a reduction in aperture ratio within the pixel. Also, the addition of the gate redundancy pattern in the pixel has made it difficult to design pixels for a high-resolution model.

It has been perceived that when only the interlayer insulating layer 115c is interposed between the horizontal line and the vertical lines, short circuits can easily occur, and the short circuits are affected by a distance between the lines. Accordingly, in an aspect of the present disclosure, the data line 116 and the power supply line 119 are disposed on a layer different from that in the conventional case. Thus, two layers including the gate insulating layer 115b and the buffer layer 115a as well as the interlayer insulating layer 115c are disposed between the vertical lines and the horizontal line. In this case, the gate insulating layer 115b and the buffer layer 115a are irrelevant to the capacity of the capacitor. Thus, the thickness of the gate insulating layer 115b and/or the buffer layer 115a can be increased. Accordingly, as a distance between the vertical lines and the horizontal line increases, the occurrence of short circuits at intersections between the vertical lines and the horizontal line can be prevented.

Accordingly, the gate redundancy pattern can be removed from the pixel. It becomes easy to design pixels for a high-resolution model and a production yield can be improved. Also, an increased aperture ratio can be secured.

As described above, the gate redundancy pattern is formed to occupy a predetermined area above and under the gate line, which has caused a reduction of an opening within the pixel. If an interlayer insulating layer is interposed between the vertical lines and the horizontal line, the thickness of the interlayer insulating layer needs to be increased to remove the gate redundancy pattern. However, the interlayer insulating layer is relevant to the capacity of the capacitor, and, thus, it is difficult to increase the thickness of the interlayer insulating layer Meanwhile, as described above, according to an aspect of the present disclosure, the vertical lines including the data line 116 and the power supply line 119 are disposed on the same layer as the light shielding layer 125. Thus, two insulating layers including the gate insulating layer 115b and the buffer layer 115a can be interposed between the vertical lines and the horizontal line. In this case, the gate insulating layer 115b and the buffer layer 115a are irrelevant to the capacity of the capacitor. Thus, the thickness of the gate insulating layer 115b and/or the buffer layer 115a can be increased. Accordingly, as a distance between the vertical lines and the horizontal line increases, the occurrence of short circuits at intersections between the vertical lines and the horizontal line can be prevented. Therefore, the gate redundancy pattern can be removed from the pixel and an opening A can be expanded as large as the gate redundancy pattern. Further, it becomes easy to design pixels for a high-resolution model and a production yield can be improved.

The protection layer 115d and the overcoating layer 115e may be disposed on the thin film transistors. The protection layer 115d is configured to protect the thin film transistors and a gate driver and other lines disposed outside the pixel region. The overcoating layer 115e is an insulating layer configured to planarize the top of the substrate 110 by reducing a step on the substrate 110.

The overcoating layer 115e may be formed of an organic insulating material. That is, the overcoating layer 115e may be formed of one of acrylic resin, epoxy resin, phenol resin, polyamide-based resin, polyimide-based resin, unsaturated polyester-based resin, polyphenylene-based resin, poly(phenylenesulfide)-based resin, benzocyclobutene, and photoresist, but is not limited thereto.

In a predetermined region of the circuit unit, the hole H may be formed by removing the overcoating layer 115e. The hole H exposes a partial surface of the protection layer 115d and, through the third contact hole 140c, the second drain electrode 123b under the third contact hole 140c.

Referring to FIG. 4, the light emitting device may be disposed on the overcoating layer 115e. For example, the light emitting device may be an organic light emitting device formed on the overcoating layer 115e. Further, the organic light emitting device may include the anode 126 electrically connected to the first drain electrode 123a of the transistor, an organic light-emission layer 127 on the anode 126, and a cathode 128 on the organic light-emission layer 127.

The anode 126 may be disposed on the overcoating layer 115e including the inside of the hole H. The anode 126 may be electrically connected to the first drain electrode 123a through the third contact hole 140c and the hole H formed in the protection layer 115d and the overcoating layer 115e. The anode 126 may be formed of a conductive material having a high work function to supply holes into the organic light-emission layer 127. The anode 126 may be formed of a transparent conductive material such as indium-tin-oxide (ITO), indium-zinc-oxide (IZO), indium tin zinc oxide (ITZO), or the like.

The anode 126 disposed inside the hole H may overlap a part (hereinafter, referred to as "storage electrode" for convenience) of the second drain electrode 123b via the protection layer 115d to form a first capacitor. The part of the second drain electrode 123b, i.e., the storage electrode, may overlap a part of the first active layer 124a via the interlayer insulating layer 115c to form a second capacitor. As described above, according to an aspect of the present disclosure, the first capacitor and the second capacitor are connected in parallel. Thus, the capacity of the all capacitors can be increased and the thickness of the protection layer 115d and the interlayer insulating layer 115c can be reduced. Therefore, the capacity of each of the first capacitor and the second capacitor can be increased compared to the conventional case. The protection layer 115d and the interlayer insulating layer 115c according to an aspect of the present disclosure may have a greater thickness than the gate insulating layer 115b and the buffer layer 115a.

FIG. 3 and FIG. 4 illustrate an example where the anode 126 is electrically connected to the first drain electrode 123a of the drive transistor, but the present disclosure is not limited thereto. The anode 126 may be configured to be electrically connected to the first source electrode 122a of the drive transistor according to the kind of the thin film transistor, the design method of the drive circuit.

The organic light-emission layer 127 is an organic layer to emit light of a specific color and may include one of a red organic light-emission layer, a green organic light-emission layer, a blue organic light-emission layer, and a white organic light-emission layer. The organic light-emission layer 127 may also include various organic layers such as a hole transport layer, a hole injection layer, an electron injection layer, an electron transport layer, and the like. FIG. 4 illustrates that the organic light-emission layer 127 has been patterned for each pixel, but the present disclosure is not limited thereto. The organic light-emission layer 127 may be a common layer commonly formed on a plurality of pixels.

The cathode 128 may be disposed on the organic light-emission layer 127. The cathode 128 may supply electrons into the organic light-emission layer 127. The cathode 128 may be formed of a transparent conductive material based on indium-tin-oxide (ITO), indium-zinc-oxide (IZO), indium tin zinc oxide (ITZO), zinc oxide (ZnO), and tin oxide (TO). Otherwise, the cathode 128 may be formed of an ytterbium (Yb) alloy or a conductive material.

Referring to FIG. 4 through FIG. 6, a bank 115f may be disposed on the anode 126 and the overcoating layer 115e. The bank 115f may cover a part of the anode 126 and a part of lines of the organic light emitting device. The bank 115f may be disposed to define adjacent pixels in the pixel region.

The bank 115f may be formed of an organic insulating material. For example, the bank 115f may be formed of resin based on polyimide, acryl, or benzocyclobutene (BCB), but the present disclosure is not limited thereto.

The bank 115f may be disposed on the overcoating layer 115e so as to surround the light emitting unit. The bank 115f may be disposed to cover the bridge line 119a under the bank 115f.

The organic light emitting device configured as described above is vulnerable to moisture. An encapsulation unit (not illustrated) configured to protect the organic light emitting device against moisture may be formed on the organic light emitting device. For example, the encapsulation unit may have a structure in which inorganic layers and organic layers are alternately laminated. However, the present disclosure is not limited thereto.

As in the above-described electro-luminescent display device, a contact hole is formed in at least one insulating layer to connect components on and under the insulating layer. In a conventional contact structure, upper and lower components, e.g., upper and lower electrodes, cover a contact hole. In this structure, the size (or area) of the contact hole is the same as a contact area between the upper and lower electrodes.

Conventionally, there has been a limitation on designing pixels due to the minimum size for patterning the contact hole.

Further, overlay margins are needed between the lower electrode and the contact hole and between the upper electrode and the contact hole, respectively. Therefore, the degree of freedom for metal in designing pixels is decreased. That is, the upper electrode needs to cover the contact hole to suppress damage to the lower electrode by an etchant for the upper electrode, and, thus, an upper margin is needed. Further, the lower electrode needs a margin in order for the contact hole to be patterned without deviating from the lower electrode. As such, the conventional contact structure needs margins for the upper and lower electrodes, which causes a decrease in the degree of freedom for metal in designing pixels.

It has been perceived that the margin for the contact hole is generated since the size (or area) of the contact hole is the same as the contact area. It has also been perceived that pixels can be designed without a limitation on the size of the contact hole if the contact structure is changed to integrate two contact holes into one. Accordingly, in an aspect of the present disclosure, two contact holes are integrated into the single seventh contact hole 140g which is greater in size (or area) than the contact area. Thus, the contact structure according to an aspect of the present disclosure enables the design of pixels without a limitation on the size of the contact hole.

That is, according to the present disclosure, the contact hole is designed to be greater in size (or area) than the contact area and two contact holes as used in the conventional case are integrated into the single seventh contact hole 140g. Therefore, pixels can be designed without a limitation on the size of the contact hole. If the contact hole is designed to be greater in size (or area) than the contact area, the above-described upper and lower margins are not needed. Therefore, it is possible to design pixels without a limitation on the size of the contact hole.

In the electro-luminescent display device according to an aspect of the present disclosure, when two contact holes for two adjacent pixels are integrated into the single seventh contact hole 140g, a dummy pattern 190 is formed at a step between the data lines 116 exposed through the seventh contact hole 140g. The dummy pattern 190 includes an active layer and a buffer layer and is formed to remove the step. Since the step between the data lines 116 is removed, when the upper conductive layer, i.e., the second source electrode 122b, is patterned, a residual photoresist layer caused by a step is not present between the data lines 116. Therefore, the occurrence of a short circuit can be prevented.

The dummy pattern 190 may include a first dummy pattern 124' and a second dummy pattern 115a' formed of an active layer and a buffer layer, respectively. The first dummy pattern 124' formed of an active layer may function as an etch-stop layer that prevents the second dummy pattern 115a' from being etched while the seventh contact hole 140g is patterned.

Hereafter, an example where the contact structure of the present disclosure is implemented in the above-described electro-luminescent display device will be described in detail with reference to the accompanying drawings.

Figure 7A:
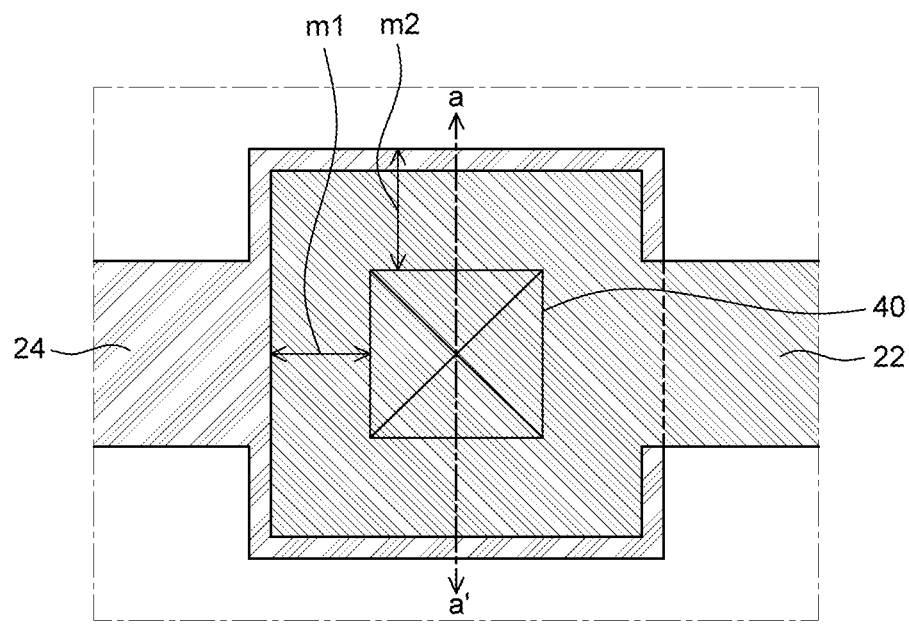
FIG. 7A and FIG. 7B are a plan view and a cross-sectional view schematically illustrating a contact structure according to a comparative example.
Figure 7B:
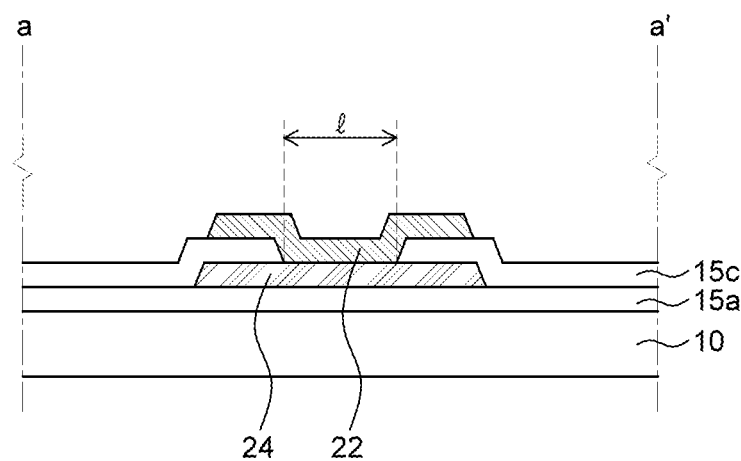
Figure 8A:
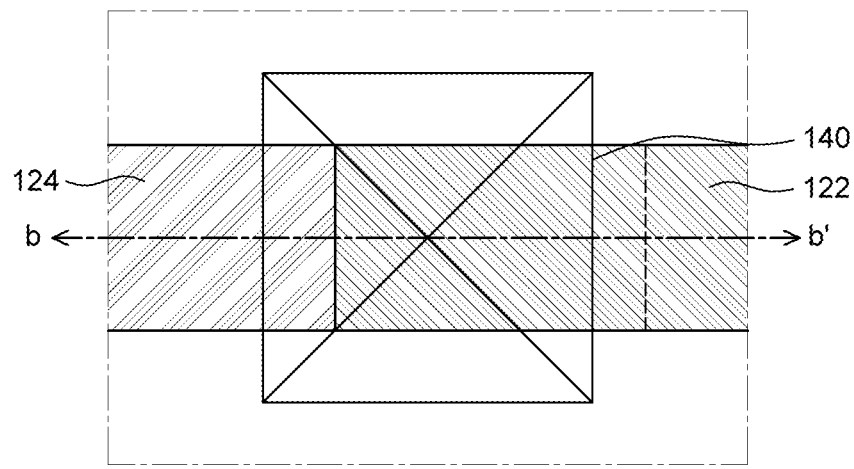
FIG. 8A and FIG. 8B are a plan view and a cross-sectional view schematically illustrating a contact structure according to an aspect of the present disclosure.
Figure 8B:
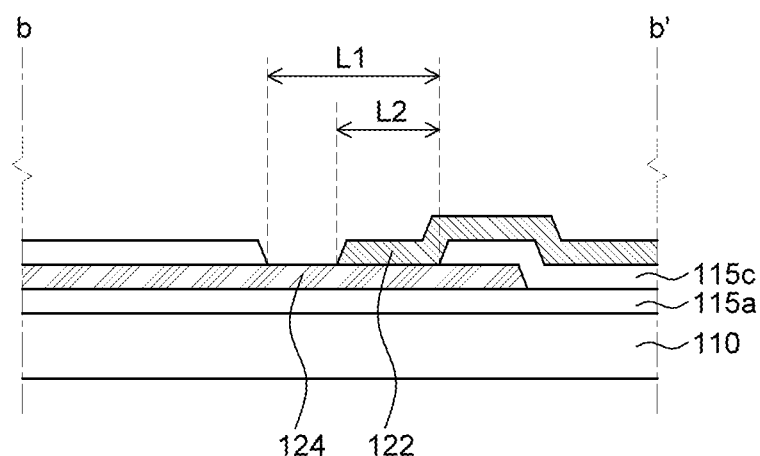

FIG. 7A and FIG. 7B respectively are a plan view and a cross-sectional view schematically illustrating a contact structure according to a comparative example. FIG. 8A and FIG. 8B respectively are a plan view and a cross-sectional view schematically illustrating a contact structure according to an aspect of the present disclosure.

FIG. 7B is a schematic cross-sectional view of the contact structure according to a comparative example shown in FIG. 7A that is taken along line a-a'. FIG. 8B is a part of a schematic cross-sectional view of the contact structure according to an aspect of the present disclosure shown in FIG. 8A that is taken along a line b-b'.

Referring to FIG. 7A and FIG. 7B, the contact structure according to a comparative example includes a lower layer 24 on a substrate 10. Further, the contact structure according to a comparative example includes an interlayer insulating layer 15c disposed on the lower layer 24 and including a contact hole 40 to expose a part of the lower layer 24. Also, the contact structure according to a comparative example includes an upper layer 22 disposed on the interlayer insulating layer 15c and connected to the lower layer 24 through the contact hole 40.

In this structure, a buffer layer 15a is further disposed under the lower layer 24.

The lower layer 24 is an active layer formed of a semiconductor and the upper layer 22 is a source electrode formed of a conductive material.

In the contact structure according to a comparative example, the upper and lower components, e.g., the upper and lower layers 22 and 24, cover the contact hole 40. In this case, the size (or area) of the contact hole 40 is the same as a contact area between the upper and lower layers 22 and 24. A length l shown in FIG. 7B represents the width of the contact hole 40. It can be seen that the length l is the same as the width of a contact portion between the upper and lower layers 22 and 24.

Conventionally, there has been a limitation on designing pixels due to the minimum size for patterning the contact hole 40.

Further, overlay margins m1 and m2 are needed between the upper layer 22 and the contact hole 40 and between the lower layer 24 and the contact hole 40, respectively. Therefore, the degree of freedom for metal in designing pixels is decreased. That is, the upper layer 22 needs to cover the contact hole 40 to suppress damage to the lower layer 24 by an etchant for the upper layer 22, and, thus, an upper margin m1 is needed. Further, the lower layer 24 needs a margin m2 in order for the contact hole 40 to be patterned without deviating from the lower layer 24. As such, the contact structure according to a comparative example needs the margins m1 and m2 for the upper and lower layers 22 and 24, which causes a decrease in the degree of freedom for metal in designing pixels.

Referring to FIG. 8A and FIG. 8B, the contact structure according to an aspect of the present disclosure includes a lower layer 124 on the substrate 110. Further, the contact structure according to an aspect of the present disclosure includes the interlayer insulating layer 115c disposed on the lower layer 124 and including a contact hole 140 to expose a part of the lower layer 124. Also, the contact structure according to an aspect of the present disclosure includes an upper layer 122 disposed on the interlayer insulating layer 115c and connected to the lower layer 124 through the contact hole 140.

In this structure, the buffer layer 115a may be further disposed under the lower layer 124.

The lower layer 124 may be an active layer formed of a semiconductor and the upper layer 122 may be a source electrode formed of a conductive material. However, the present disclosure is not limited thereto.

In the contact structure according to an aspect of the present disclosure, the contact hole 140 is designed to be greater in size (or area) than the contact area. Therefore, it is possible to design pixels without a limitation on the size of the contact hole 140. That is, for example, a length L1 shown in FIG. 8B represents the width of the contact hole 140. It can be seen that the length L1 is longer than a width L2 of a contact portion between the upper and lower layers 122 and 124. As such, if the contact hole 140 is designed to be greater in size (or area) than the contact area, the above-described upper and lower margins are not needed. Therefore, it is possible to design pixels without a limitation on the size of the contact hole 140.

The contact hole 140 may expose a partial upper surface of the lower layer 124 and a partial upper surface of the buffer layer 115a. Further, the upper layer 122 may be in contact with the exposed partial upper surface of the lower layer 124 and the exposed partial upper surface of the buffer layer 115a.

The above-described structure is suitable for the case where the lower layer 124 is not damaged while the upper layer 122 is etched. If the lower layer is damaged, another structure may be applied.

Figure 9A:
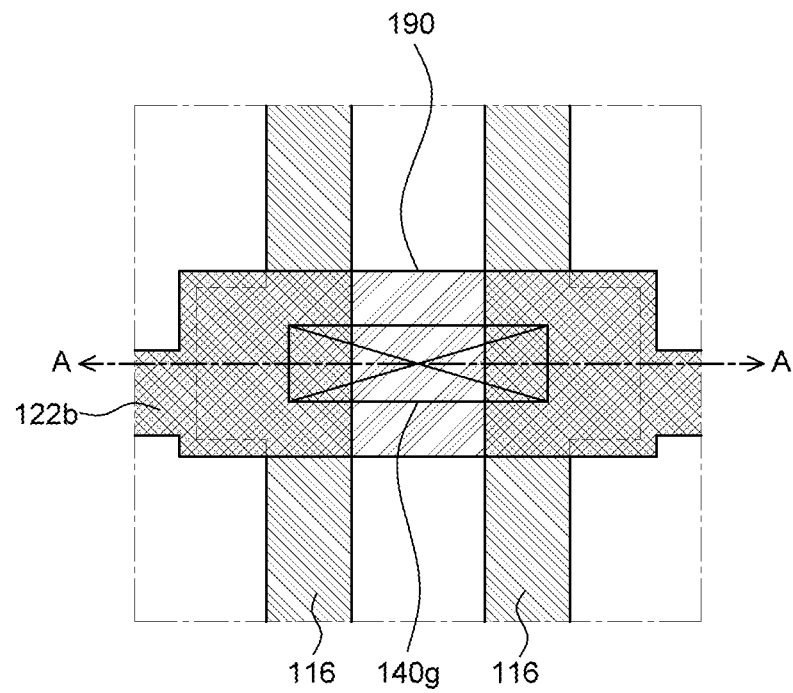
FIG. 9A and FIG. 9B are a plan view and a cross-sectional view schematically illustrating an example of the contact structure according to an aspect of the present disclosure.
Figure 9B:
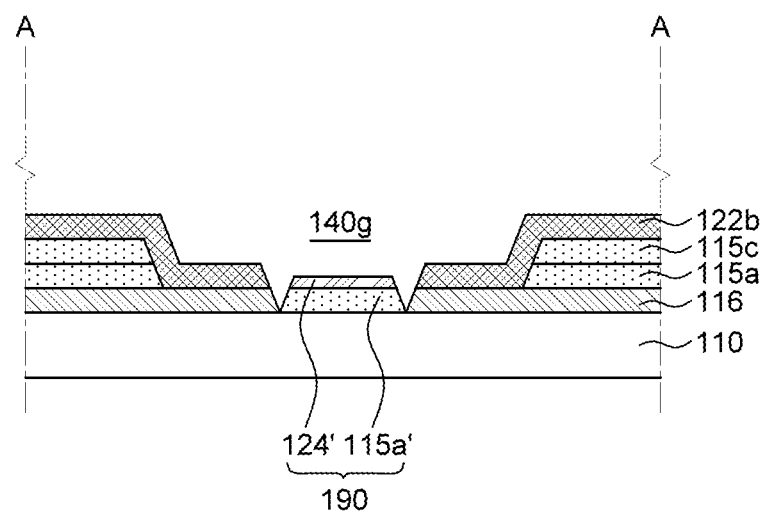

FIG. 9A and FIG. 9B are a plan view and a cross-sectional view schematically illustrating an example of the contact structure according to an aspect of the present disclosure.

FIG. 9A and FIG. 9B illustrate an example where two contact holes for two adjacent pixels as used in the conventional case are integrated into one for a contact between a vertical line and a source/drain electrode. FIG. 9B is a schematic cross-sectional view of an example of the contact structure according to an aspect of the present disclosure shown in FIG. 9A that is taken along a line A-A'.

Referring to FIG. 9A and FIG. 9B, an example of the contact structure according to an aspect of the present disclosure includes a lower layer, e.g., the data line 116, on the substrate 110. Further, an example of the contact structure according to an aspect of the present disclosure includes the buffer layer 115a disposed on the data line 116 and including the seventh contact hole 140g to expose a part of the data line 116. Also, an example of the contact structure according to an aspect of the present disclosure includes the interlayer insulating layer 115c and an upper layer, e.g., the second source electrode 122b, disposed on the interlayer insulating layer 115c and connected to the data line 116 through the seventh contact hole 140g.

The data line 116 may be formed of a first conductive material and the second source electrode 122b may be formed of a second conductive material. In this case, the first conductive material may be different from the second conductive material.

The seventh contact hole 140g according to an aspect of the present disclosure may have a greater area than a contact area between the second source electrode 122b and the data line 116.

In this case, the data line 116 includes two adjacent lines and the second source electrode 122b may be connected to each data line 116 through the single seventh contact hole 140g.

The seventh contact hole 140g may expose a partial upper surface of each data line 116, a lateral surface of each data line 116, and an upper surface of the dummy pattern 190 between the two data lines 116.

As described above, in the electro-luminescent display device according to an aspect of the present disclosure, the dummy pattern 190 is formed at a step between the data lines 116 exposed by the seventh contact hole 140g to remove the step.

The dummy pattern 190 may include the first dummy pattern 124' and the second dummy pattern 115a' formed of an active layer and a buffer layer, respectively. The first dummy pattern 124' formed of an active layer may function as an etch-stop layer that stops etching of the second dummy pattern 115a' while the seventh contact hole 140g is patterned.

The dummy pattern 190, particularly the first dummy pattern 124', may have the same or greater width than at least the second source electrode 122b. The first dummy pattern 124' may have a smaller width than the second source electrode 122b. However, in this case, a residual photoresist layer caused by a step can be present between the data lines 116 where the first dummy pattern 124' cannot cover while the second source electrode 122b is patterned.

Further, FIG. 9A and FIG. 9B illustrate an example where the dummy pattern 190 is formed between the data lines 116, but the present disclosure is not limited thereto. The dummy pattern 190 of the present disclosure may also cover a partial upper surface of each data line 116. In this case, it is possible to more effectively remove the step between the data lines 116.

Each second source electrode 122b may be in contact with the exposed partial upper surface of each data line 116. A lateral surface of each data line 116 which is not in contact with the second source electrode 122b may be exposed without being covered by the buffer layer 115a and the interlayer insulating layer 115c.

As described above, according to an aspect of the present disclosure, the step between the data lines 116 is removed. Therefore, while the upper conductive layer, i.e., the second source electrode 122b, is patterned, a residual photoresist layer caused by a step is not present between the data lines 116. Accordingly, the occurrence of a short defect can be suppressed.

Figure 10:
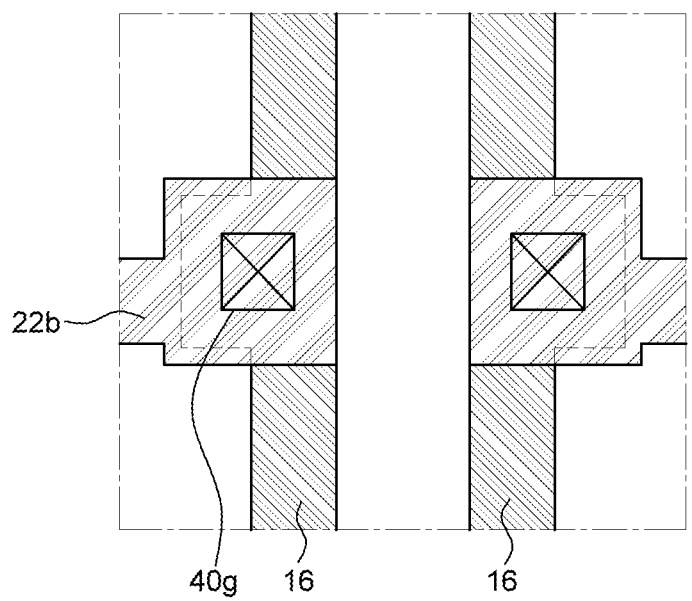
FIG. 10 is a plan view illustrating an example of a contact structure according to Comparative Example 1.
Figure 11A:
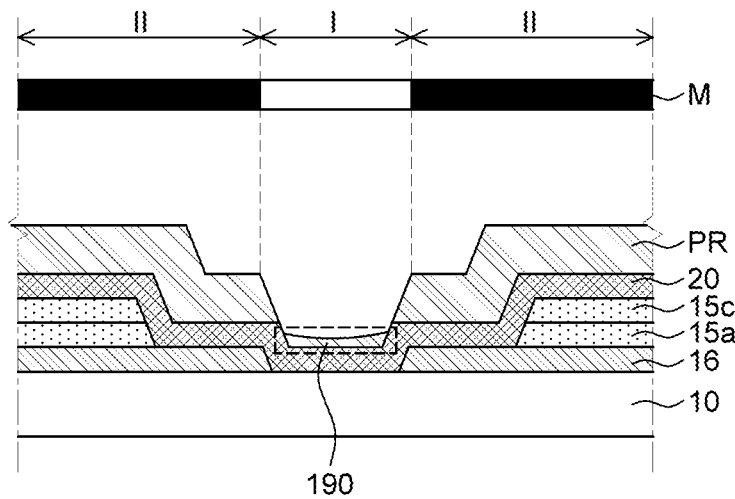
FIG. 11A and FIG. 11B are cross-sectional views illustrating an example of a part of the process for patterning a second source electrode according to Comparative Example 2.
Figure 11B:
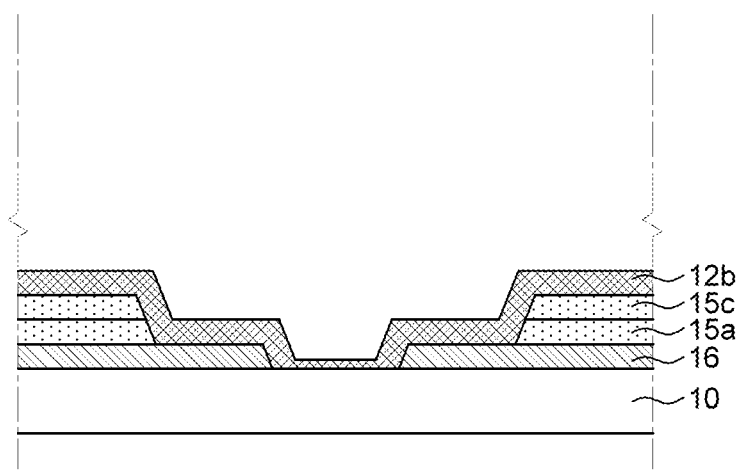

FIG. 10 is a plan view illustrating an example of a contact structure according to Comparative Example 1. FIG. 11A and FIG. 11B are cross-sectional views illustrating an example of a process for patterning a second source electrode according to Comparative Example 2.

FIG. 10 shows a contact structure according to Comparative Example 1 in which a contact hole is formed for each pixel. FIG. 11A and FIG. 11B show a part of a process for patterning a second source electrode according to Comparative Example 2 in which two contact holes as used in the conventional case are integrated into one but a dummy pattern is not formed between data lines.

Referring to FIG. 10, it can be seen that in Comparative Example 1, a seventh contact hole 40g has the same area as a contact area between a second source electrode 22b and a data line 16. Further, it can be seen that the seventh contact hole 40g is individually used for a contact between the source electrode 22b and the data line 16. In this case, there is a limitation on designing pixels due to the minimum size for patterning the seventh contact hole 40g. Further, the upper and lower electrodes, i.e., the second source electrode 22b and the data line 16 need margins, which causes a decrease in the degree of freedom for metal in designing pixels.

Referring to FIG. 11A, in Comparative Example 2, the data line 16, the buffer layer 15a and the interlayer insulating layer 15c are formed on the substrate 10 and then the seventh contact hole is formed to expose a part of the data lines 16 of the adjacent pixels. In this case, it can be seen that the buffer layer 15a and the interlayer insulating layer 15c are relatively removed, and, thus, a step is generated between the data lines 16.

Then, a conductive film 20 and a predetermined photoresist layer PR are formed on the entire substrate 10 to form a second source electrode.

Then, a predetermined mask M including a transmissive area I and a shielding area II is used to perform exposure and development to the photoresist layer PR.

In this case, a residual photoresist layer PR' is present between the data lines 16 due to the leaning of the photoresist layer caused by a step.

Referring to FIG. 11B, it can be seen that when the conductive film is etched while the residual photoresist layer remains, a second source electrode 12b being in a short state is formed between the adjacent pixels.

However, according to the present disclosure, the step between the data lines is removed. Thus, when the upper conductive layer, i.e., the second source electrode, is patterned, a residual photoresist layer caused by a step is not present between the data lines. Accordingly, the occurrence of a short defect can be suppressed. Details thereof will be described with reference to the illustrations of the manufacturing process.

FIG. 12A through FIG. 12F are cross-sectional views sequentially illustrating a process for manufacturing an electro-luminescent display device according to an aspect of the present disclosure.

Figure 12A:
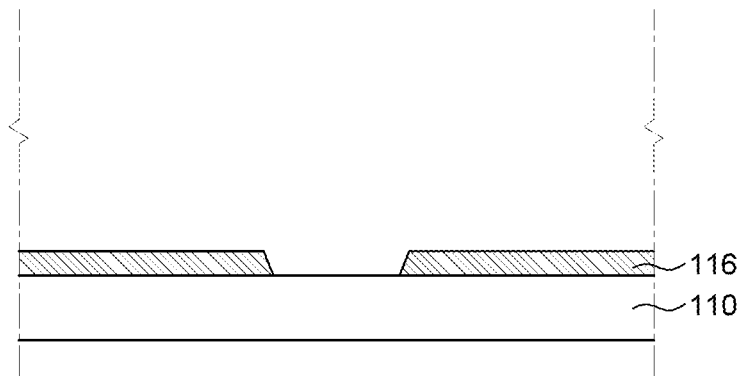
FIG. 12A through FIG. 12F are cross-sectional views sequentially illustrating a process for manufacturing an electro-luminescent display device according to an aspect of the present disclosure.

Referring to FIG. 12A, the data lines 116, a vertical line of a power supply line, and a light shielding layer may be formed on the transparent substrate 110.

The light shielding layer may function to block the effect of light from the outside or neighboring light emitting devices on a first active layer and may be disposed as the lowermost layer on the substrate 110.

The data lines 116 and the power supply line (and reference line) of the present disclosure may be disposed on the same layer as the light shielding layer in the first direction. The data lines 116 and the power line of the present disclosure as well as the light shielding layer 125 are disposed as the lowermost layer on the substrate 110.

The data lines 116, the power line, and the light shielding layer may be formed by forming a first metal layer on the substrate 110 and selectively patterning the first metal layer through a mask process.

The mask process refers to a series of processes including: forming a photoresist layer on a substrate; performing exposure and development using a mask to form a predetermined photoresist pattern; and performing etching using the photoresist pattern as an etching mask.

Figure 12B:
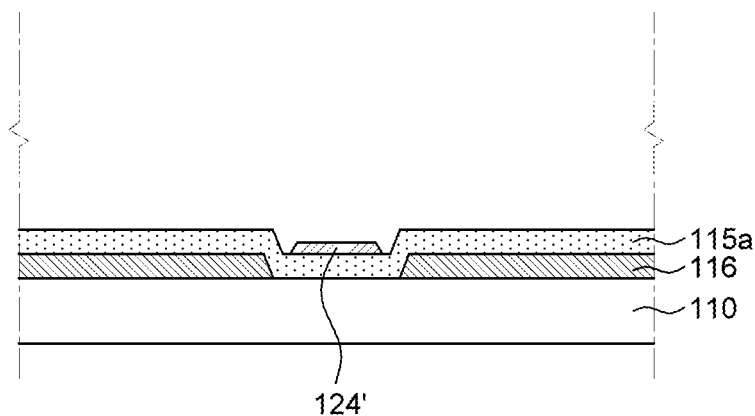

Then, referring to FIG. 12B, the buffer layer 115a may be formed on the substrate 110 on which the data lines 116, the power line, and the light shielding layer have been formed.

The buffer layer 115a may be disposed on the substrate 110 so as to cover the light shielding layer, the data lines 116, and the power supply line.

Then, although not illustrated in the drawings, the buffer layer 115a may be patterned through a mask process to form an eighth contact hole and a ninth contact hole to expose a part of the power supply line and the light shielding layer. However, the present disclosure is not limited thereto. The eighth contact hole and the ninth contact hole may be formed in a later process.

When the eighth contact hole and the ninth contact hole are formed, the buffer layer 115a may be patterned to pre-form a second dummy pattern to be described later between the data lines 116 of the adjacent pixels. However, the present disclosure is not limited thereto.

Then, a first active layer and a second active layer may be formed on the substrate 110.

According to the present disclosure, when the first and second active layers are formed, the first dummy pattern 124' including the first and second active layers is formed between the data lines 116 of the adjacent pixels.

The first and second active layers and the first dummy pattern 124' may be formed of an oxide semiconductor containing at least one metal selected from Zn, Cd, Ga, In, Sn, Hf, and Zr, a-Si, poly-Si, or an organic semiconductor.

Then, a gate insulating layer and a second metal layer may be formed sequentially on the entire substrate 110.

Then, the gate insulating layer 115b and the second metal layer may be selectively patterned through a mask process to form first and second gate electrodes of the second metal layer on the first and second active layers.

Herein, the gate insulating layer may be formed of a single layer of an inorganic material such as silicon nitride ($SiN_x$), silicon oxide ($SiO_x$), a multilayer of silicon nitride ($SiN_x$), and silicon oxide ($SiO_x$).

The second metal layer may be formed of one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

The first and second active layers may be formed to overlap the first and second gate electrodes, respectively, on the gate insulating layer. Thus, channels may be formed between the first source electrode and the first drain electrode and between the second source electrode and the second drain electrode, respectively.

As described above, the gate insulating layer may be formed only under the first gate electrode, but the present disclosure is not limited thereto. The gate insulating layer may be formed on the entire substrate on which the first and second active layers have been formed.

A gate line may be disposed on the same layer as the first and second gate electrodes. In this case, the above-described gate insulating layer may be disposed under the gate line. However, the present disclosure is not limited thereto.

If the second dummy pattern is preformed when the eighth and ninth contact holes are formed as described above, the first dummy pattern 124' may be formed on the second dummy pattern while the first and second active layers are patterned.

Figure 12C:
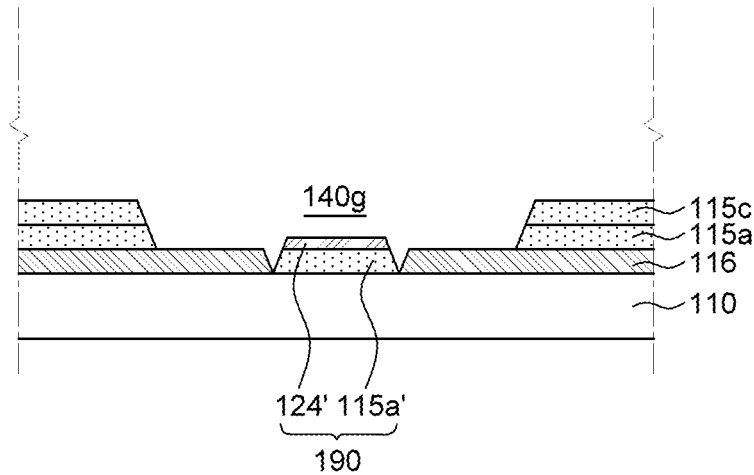

Then, referring to FIG. 12C, the interlayer insulating layer 115c may be formed on the substrate 110.

The interlayer insulating layer 115c may be formed of a single layer of an inorganic material such as silicon nitride ($SiN_x$), silicon oxide ($SiO_x$), a multilayer of silicon nitride ($SiN_x$), and silicon oxide ($SiO_x$). The interlayer insulating layer 115c may be formed on the entire substrate 110 or only on the pixel region, but the present disclosure is not limited thereto.

Then, the interlayer insulating layer 115c may be selectively patterned through a mask process. Thus, first and second contact holes to expose a source region and a drain region of the first active layer and fourth and fifth contact holes to expose a source region and a drain region of the second active layer may be formed. Further, a sixth contact hole to expose a part of the first gate electrode may be formed through the mask process.

Further, the interlayer insulating layer 115c and the buffer layer 115a may be selectively patterned through the mask process. Thus, the seventh contact hole 140g to expose a part of the data lines 116 of the adjacent pixels may be formed.

The seventh contact hole 140g according to the present disclosure may have a greater area than a contact area between the second source electrode and the data line 116.

According to the present disclosure, the dummy pattern 190 including an active layer and a buffer layer is formed between the data lines 116 exposed by the seventh contact hole 140g.

The dummy pattern 190 may include the first dummy pattern 124' and the second dummy pattern 115a' formed of an active layer and a buffer layer, respectively.

The seventh contact hole 140g may expose a partial upper surface of each data line 116, a lateral surface of each data line 116, and an upper surface of the dummy pattern 190 between the two data lines 116.

As described above, according to an aspect of the present disclosure, two contact holes for two adjacent pixels are integrated into the seventh contact hole 140g. In this case, the first dummy pattern 124' is formed of an active layer between the data lines 116 of the adjacent pixels and stops etching of a buffer layer under the first dummy pattern 124' while the seventh contact hole 140g is patterned. Thus, the second dummy pattern 115a' may be formed of the buffer layer under the first dummy pattern 124'.

The dummy pattern 190, particularly the first dummy pattern 124', may have the same or greater width than at least the second source electrode. The first dummy pattern 124' may have a smaller width than the second source electrode. However, in this case, a residual photoresist layer caused by a step can be present between the data lines 116 where the first dummy pattern 124' cannot cover while the second source electrode is patterned.

FIG. 12C illustrates an example where the dummy pattern 190 is formed between the data lines 116, but the present disclosure is not limited thereto. The dummy pattern 190 may also cover a partial upper surface of each data line 116. In this case, it is possible to more effectively remove the step between the data lines 116.

Figure 12D:
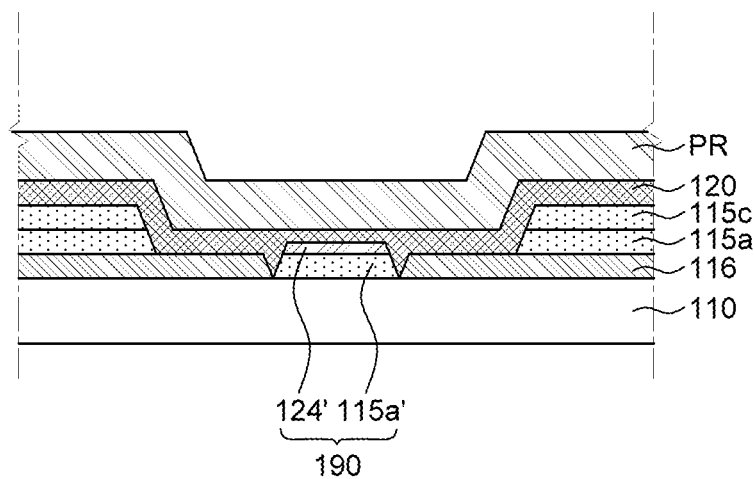

Then, referring to FIG. 12D, a third metal layer 120 and a photoresist layer PR are formed on the entire substrate 110.

The third metal layer 120 may be formed of any one of various conductive materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

In this case, according to an aspect of the present disclosure, the dummy pattern 190 is formed between the data lines 116, and, thus, a step is reduced. Therefore, the third metal layer 120 and the photoresist layer PR may be formed relatively flat on the dummy pattern 190 and the data lines 116.

Figure 12E:
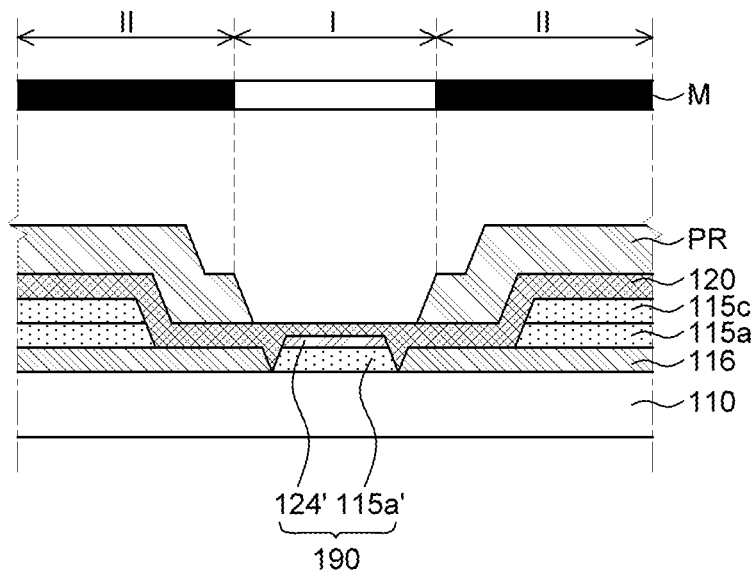

Then, referring to FIG. 12E, a predetermined mask M is located above the substrate 110 on which the photoresist layer PR has been formed entirely.

The mask M may include a transmissive area I and a shielding area II.

When the photoresist layer PR of positive type is used, the shielding area II of the mask M may correspond to an area to be remained after patterning of the third metal layer 120. In this area, first and second source electrodes, first and second drain electrodes, and a bridge line are to be formed. Further, the transmissive area I may correspond to an area where the third metal layer 120 is to be removed. However, the present disclosure is not limited thereto.

Then, the photoresist layer PR is exposed and developed using the mask M, and, thus, the photoresist layer PR corresponding to the transmissive area I is removed.

Figure 12F:
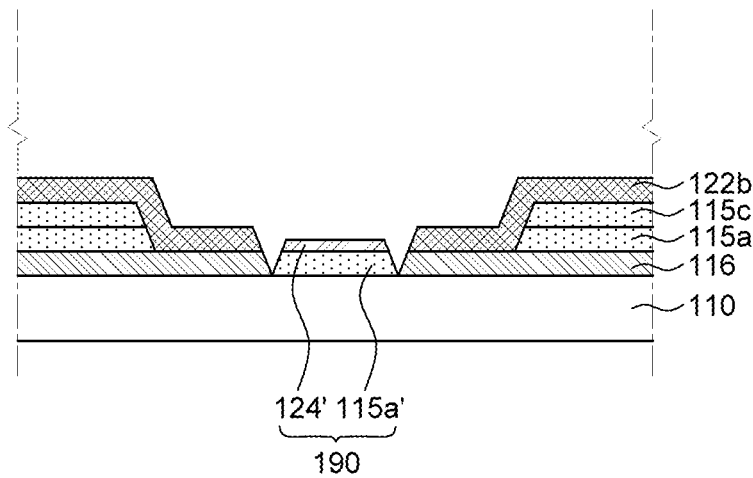

Then, referring to FIG. 12F, the third metal layer 120 may be selectively patterned to form a first source electrode, the second source electrode 122b, first and second drain electrodes, and a bridge line.

The first source electrode and the second source electrode 122b may be connected to source regions of the first and second active layers through the first and fourth contact holes, respectively, penetrating the interlayer insulating layer 115c. The first and second drain electrodes may be connected to drain regions of the first and second active layers through the second and fifth contact holes, respectively, penetrating the interlayer insulating layer 115c.

Further, the second source electrode 122b may be electrically connected to the data lines 116 through the seventh contact hole 140g.

In this case, according to an aspect of the present disclosure, the step between the data lines 116 is removed. Thus, when the upper conductive layer, i.e., the second source electrode 122b, is patterned, a residual photoresist layer caused by a step is not present between the data lines 116. Accordingly, the occurrence of a short defect can be suppressed.

Each second source electrode 122b may be in contact with the exposed partial upper surface of each data line 116. A lateral surface of each data line 116 which is not in contact with the second source electrode 122b may be exposed without being covered by the buffer layer 115a and the interlayer insulating layer 115c.

Further, the second drain electrode of the switching transistor may be extended in one direction to be electrically connected to the first gate electrode of the drive transistor. Specifically, the second drain electrode may be connected to the first gate electrode through the sixth contact hole penetrating the interlayer insulating layer 115c.

In this case, a power supply line may be connected to the first source electrode of an adjacent pixel region through the bridge line protruding toward the pixel region. The bridge line may be extended to the adjacent pixel region in a direction parallel to the first direction. The bridge line extended to the adjacent pixel region may be connected to the first source electrode of the adjacent pixel region through the first contact hole.

One side of the bridge line may be extended vertically along the power supply line and connected through the eighth contact hole to the power supply line under the eighth contact hole.

After the first source electrode, the second source electrode 122b, the first and second drain electrodes, and the bridge line are formed as described above, a protection layer, which is not illustrated though, may be formed on the substrate 110.

Then, the protection layer may be patterned through a mask process to form a third contact hole that exposes a part of the first drain electrode.

Then, an overcoating layer may be formed on the substrate 110.

The overcoating layer may be formed of an organic insulating material. That is, the overcoating layer may be formed of one of acrylic resin, epoxy resin, phenol resin, polyamide-based resin, polyimide-based resin, unsaturated polyester-based resin, polyphenylene-based resin, poly(phenylenesulfide)-based resin, benzocyclobutene, and photoresist, but is not limited thereto.

In a predetermined region of the circuit unit, a hole may be formed by removing the overcoating layer. The hole exposes a partial surface of the protection layer and, through the third contact hole, the second drain electrode under the third contact hole.

Then, a light emitting device may be disposed on the substrate 110. The light emitting device as an organic light emitting device is formed on the overcoating layer. Further, the organic light emitting device may include an anode electrically connected to the first drain electrode of the transistor, an organic light-emission layer on the anode, and a cathode on the organic light-emission layer.

The anode may be disposed on the overcoating layer including the inside of the hole. The anode may be electrically connected to the first drain electrode through the third contact hole and the hole formed in the protection layer and the overcoating layer. The anode may be formed of a conductive material having a high work function to supply holes into the organic light-emission layer. The anode may be formed of a transparent conductive material such as indium-tin-oxide (ITO), indium-zinc-oxide (IZO), indium tin zinc oxide (ITZO), or the like.

The anode disposed inside the hole may overlap a part of the second drain electrode via the protection layer to form a first capacitor. The part of the second drain electrode may overlap a part of the first active layer via the interlayer insulating layer to form a second capacitor.

The organic light-emission layer is an organic layer to emit light of a specific color and may include any one of a red organic light-emission layer, a green organic light-emission layer, a blue organic light-emission layer, and a white organic light-emission layer. The organic light-emission layer may also include various organic layers such as a hole transport layer, a hole injection layer, an electron injection layer, an electron transport layer, and the like.

The cathode may be disposed on the organic light-emission layer. The cathode may supply electrons into the organic light-emission layer. The cathode may be formed of a transparent conductive material based on indium-tin-oxide (ITO), indium-zinc-oxide (IZO), indium tin zinc oxide (ITZO), zinc oxide (ZnO), and tin oxide (TO). Otherwise, the cathode may be formed of an ytterbium (Yb) alloy or a conductive material.

Further, a bank may be formed on the anode and the overcoating layer. The bank may cover a part of the anode and a part of lines of the organic light emitting device. The bank may be disposed to define adjacent pixels in the pixel region.

The bank may be formed of an organic insulating material. For example, the bank may be formed of resin based on polyimide, acryl, or benzocyclobutene (BCB), but the present disclosure is not limited thereto.

The bank may be disposed on the overcoating layer so as to surround the light emitting unit. The bank may be disposed to cover the bridge line under the bank.

The organic light emitting device configured as described above is vulnerable to moisture. An encapsulation unit configured to protect the organic light emitting device against moisture may be formed on the organic light emitting device. For example, the encapsulation unit may have a structure in which inorganic layers and organic layers are alternately laminated. However, the present disclosure is not limited thereto.

The dummy pattern of the present disclosure may be formed between the data lines and may also cover partial upper surfaces of the data lines. Details thereof will be described with reference to the accompanying drawings.

Figure 13A:
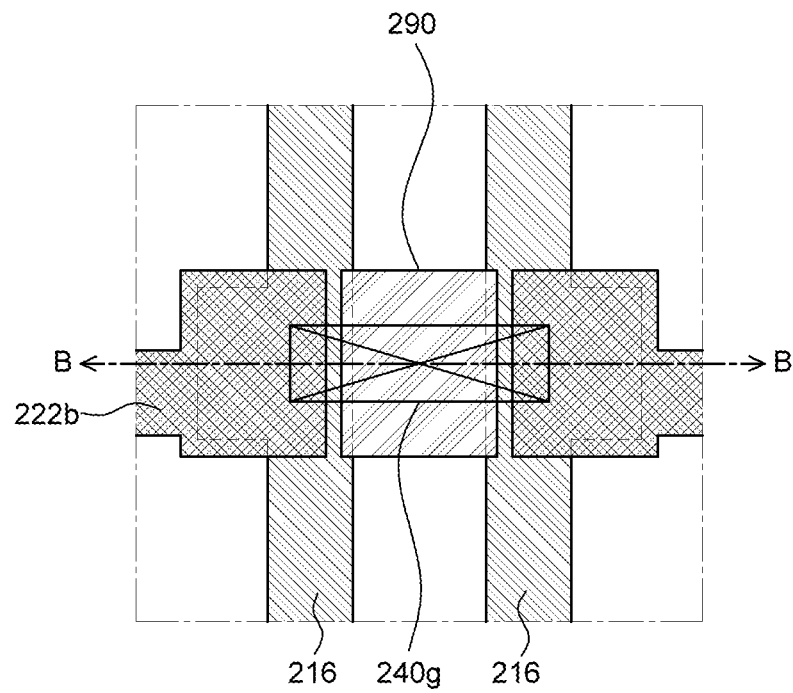
FIG. 13A and FIG. 13B respectively are a plan view and a cross-sectional view schematically illustrating another example of the contact structure according to an aspect of the present disclosure.
Figure 13B:
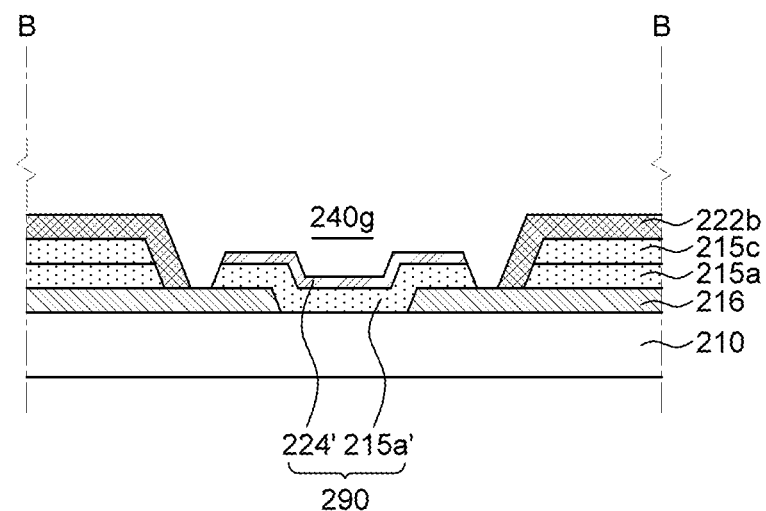

FIG. 13A and FIG. 13B are a plan view and a cross-sectional view schematically illustrating another example of the contact structure according to an aspect of the present disclosure.

Another example of the contact structure according to an aspect of the present disclosure illustrated in FIG. 13A and FIG. 13B is substantially the same as the above-described contact structure according to an aspect of the present disclosure except the configuration of a dummy pattern. Therefore, explanation of the same parts will be omitted.

FIG. 13A and FIG. 13B illustrate an example where two contact holes for two adjacent pixels as used in the conventional case are integrated into one for a contact between a vertical line and a source/drain electrode. FIG. 13B is a schematic cross-sectional view of another example of the contact structure according to an aspect of the present disclosure shown in FIG. 13A that is taken along a line B-B'.

Referring to FIG. 13A and FIG. 13B, another example of the contact structure according to an aspect of the present disclosure includes a lower layer, e.g., a data line 216, on a substrate 210. Further, another example of the contact structure according to an aspect of the present disclosure includes a buffer layer 215*a* disposed on the data line 216 and including a seventh contact hole 240*g* to expose a part of the data line 216. Also, another example of the contact structure according to an aspect of the present disclosure includes an interlayer insulating layer 215*c* and an upper layer, e.g., a second source electrode 222*b*, disposed on the interlayer insulating layer 215*c* and connected to the data line 216 through the seventh contact hole 240*g*.

The data line 216 may be formed of a first conductive material and the second source electrode 222*b* may be formed of a second conductive material. In this case, the first conductive material may be different from the second conductive material.

The seventh contact hole 240*g* according to an aspect of the present disclosure may have a greater area than a contact area between the second source electrode 222*b* and the data line 216.

In this case, the data line 216 includes two adjacent lines and the second source electrode 222*b* may be connected to each data line 216 through the single seventh contact hole 240*g*.

The seventh contact hole 240*g* may expose a partial upper surface of each data line 216 and an upper surface of a dummy pattern 290.

As described above, in the electro-luminescent display device according to an aspect of the present disclosure, the dummy pattern 290 is formed between the data lines 216 exposed by the seventh contact hole 240*g* and covers partial upper surfaces of the data lines 116 to remove a step. In this case, it is possible to more effectively remove the step between the data lines 216.

The dummy pattern 290 may include a first dummy pattern 224' and a second dummy pattern 215*a'* formed of an active layer and a buffer layer, respectively. The first dummy pattern 224' formed of an active layer may function as an etch-stop layer that stops etching of the second dummy pattern 215*a'* while the seventh contact hole 240*g* is patterned.

The dummy pattern 290, particularly the first dummy pattern 224', may have the same or greater width than at least the second source electrode 222*b*. The first dummy pattern 224' may have a smaller width than the second source electrode 222*b*. However, in this case, a residual photoresist layer caused by a step can be present between the data lines 216 where the first dummy pattern 224' cannot cover while the second source electrode 222*b* is patterned.

[As described above, the dummy pattern 290 of the present disclosure may be formed between the data lines 216 and may also cover a partial upper surface of each data line 216. In this case, it is possible to more effectively remove the step between the data lines 216.

Each second source electrode 222*b* may be in contact with the exposed partial upper surface of each data line 216. A lateral surface of each data line 216 which is not in contact with the second source electrode 222*b* may not be exposed by being covered by the dummy pattern 290.

As described above, according to an aspect of the present disclosure, the step between the data lines 216 is removed. Therefore, while the upper conductive layer, i.e., the second source electrode 222*b*, is patterned, a residual photoresist layer caused by a step is not present between the data lines 216. Accordingly, the occurrence of a short defect can be suppressed.

The exemplary aspects of the present disclosure can also be described as follows:

According to an aspect of the present disclosure, there is provided an electro-luminescent display device. The electro-luminescent display device includes a data line disposed in a first direction on a substrate; a first insulating layer disposed on the data line; an active layer disposed on the first insulating layer; a gate line disposed above the first insulating layer interposing at least a second insulating layer therebetween in a second direction crossing the first direction and defining a pixel region together with the data line; a gate electrode disposed above the active layer interposing the second insulating layer; a third insulating layer disposed on the gate electrode and the gate line; a source electrode and a drain electrode disposed on the third insulating layer and connected to the active layer; a contact hole provided between both data lines of adjacent pixel regions and electrically connecting the source electrode and the data line since the first insulating layer and the third insulating layer are removed; and a dummy pattern provided between the both data lines and including a semiconductor layer as the active layer and the first insulating layer, wherein the contact hole has a greater area than a contact area between the source electrode and the data line.

The electro-luminescent display device may further include a fourth insulating layer disposed on the source electrode and the drain electrode; and a light emitting device disposed in a light emitting unit of the pixel region on the fourth insulating layer.

The contact hole may expose a partial upper surface of each data line, a lateral surface of each data line, and an upper surface of the substrate between the both data lines.

Each source electrode may be electrically connected to the exposed partial upper surface of each data line.

The dummy pattern may include a first dummy pattern made of the semiconductor layer and a second dummy pattern made of the first insulating layer under the first dummy pattern.

The first dummy pattern may function as an etch-stop layer that stops etching of the second dummy pattern.

The first dummy pattern may have the same or greater width than at least the second source electrode.

The dummy pattern may be disposed between the both data lines and covers partial upper surfaces of the data lines According to another aspect of the present disclosure, there is provided an electro-luminescent display device. The electro-luminescent display device includes a data line and a gate line disposed intersecting each other on a substrate and defining a pixel region; a first insulating layer disposed on the data line; an active layer disposed on the first insulating layer; a gate electrode disposed above the active layer interposing a second insulating layer therebetween; a third insulating layer disposed on the gate electrode and the gate line; a source electrode and a drain electrode disposed on the third insulating layer and connected to the active layer; a contact hole provided between both data lines of adjacent pixel regions and electrically connecting the source electrode and the data line since the first insulating layer and the third insulating layer are removed; and a dummy pattern provided between the both data lines, including a semiconductor layer as the active layer and the first insulating layer to planarize a step between the both data lines.

The contact hole may have a greater area than a contact area between the source electrode and the data line.

The data line may be disposed on the substrate in a first direction, and the gate line may be disposed above the first insulating layer interposing at least the second insulating layer therebetween in a second direction crossing the first direction.

The contact hole may expose a partial upper surface of each data line, a lateral surface of each data line, and an upper surface of the substrate between the both data lines.

Each source electrode may be electrically connected to the exposed partial upper surface of each data line.

The dummy pattern may include a first dummy pattern made of the semiconductor layer and a second dummy pattern made of the first insulating layer under the first dummy pattern.

The first dummy pattern may function as an etch-stop layer that stops etching of the second dummy pattern.

The first dummy pattern may have the same or greater width than at least the second source electrode.

The dummy pattern may be disposed between the both data lines and covers partial upper surfaces of the data lines.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electro-luminescent display device, comprising:
   a data line disposed in a first direction on a substrate;
   a first insulating layer disposed on the data line;
   an active layer disposed on the first insulating layer;
   a gate line disposed above the first insulating layer in a second direction crossing the first direction to define a pixel region with the data line;
   a second insulating layer interposed between the first insulating layer and the gate line;
   a gate electrode disposed above the active layer and the second insulating layer interposed between the gate electrode and the active layer;
   a third insulating layer disposed on the gate electrode and the gate line;
   a source electrode and a drain electrode disposed on the third insulating layer and electrically connected to the active layer;
   a contact hole disposed between adjacent data lines of adjacent pixel regions and electrically connecting the source electrode and the data line, wherein the contact hole is formed by removing portions of the first insulating layer and the third insulating layer and has an area greater than a contact area between the source electrode and the data line; and
   a dummy pattern provided between the data lines of the adjacent pixel regions and including the active layer of a semiconductor layer and the first insulating layer.

2. The electro-luminescent display device according to claim 1, further comprising:
   a fourth insulating layer disposed on the source electrode and the drain electrode; and
   a light emitting device disposed at a light emitting unit of the pixel region and disposed on the fourth insulating layer.

3. The electro-luminescent display device according to claim 1, wherein the contact hole exposes a portion of upper surface of each data line, a lateral surface of each data line and an upper surface of the substrate between the adjacent data lines of the adjacent pixel regions.

4. The electro-luminescent display device according to claim 3, wherein each source electrode is electrically connected to the exposed portion of the upper surface of each data line.

5. The electro-luminescent display device according to claim 1, wherein the dummy pattern includes a first dummy pattern of the semiconductor layer and a second dummy pattern of the first insulating layer under the first dummy pattern.

6. The electro-luminescent display device according to claim 5, wherein the first dummy pattern functions as an etch-stop layer that prevents the second dummy pattern from being etched.

7. The electro-luminescent display device according to claim 5, wherein the first dummy pattern has a same or greater width than the second source electrode.

8. The electro-luminescent display device of claim 1, wherein the dummy pattern is disposed between the data lines and covers a portion of upper surfaces of the adjacent data lines of the adjacent pixel regions.

9. An electro-luminescent display device, comprising:
- a data line and a gate line disposed intersecting each other on a substrate and defining a pixel region;
- a first insulating layer disposed on the data line;
- an active layer disposed on the first insulating layer;
- a gate electrode disposed above the active layer;
- a second insulating layer interposed between the active layer and the gate electrode;
- a third insulating layer disposed on the gate electrode and the gate line;
- a source electrode and a drain electrode disposed on the third insulating layer and electrically connected with the active layer;
- a contact hole provided between adjacent data lines of adjacent pixel regions and electrically connecting the source electrode and the data line since the first insulating layer and the third insulating layer are removed; and
- a dummy pattern provided between the adjacent data lines of the adjacent pixel regions, including the active layer of a semiconductor layer and the first insulating layer planarizing a step between the adjacent data lines of the adjacent pixel regions.

10. The electro-luminescent display device according to claim 9, wherein the contact hole has a greater area than a contact area between the source electrode and the data line.

11. The electro-luminescent display device according to claim 9, wherein the data line is disposed on the substrate in a first direction, the gate line is disposed above the first insulating layer and the second insulating layer is interposed between the gate line and the first insulating layer in a second direction crossing the first direction.

12. The electro-luminescent display device according to claim 9, wherein the contact hole exposes a portion of an upper surface of each data line, a lateral surface of each data line, and an upper surface of the substrate between the adjacent data lines of the adjacent pixel regions.

13. The electro-luminescent display device according to claim 12, wherein each source electrode is electrically connected with the exposed portion of the upper surface of each data line.

14. The electro-luminescent display device according to claim 9, wherein the dummy pattern includes a first dummy pattern of the semiconductor layer and a second dummy pattern of the first insulating layer under the first dummy pattern.

15. The electro-luminescent display device according to claim 14, wherein the first dummy pattern functions as an etch-stop layer that prevents the second dummy pattern from being etched.

16. The electro-luminescent display device according to claim 14, wherein the first dummy pattern has a same or greater width than the second source electrode.

17. The electro-luminescent display device according to claim 9, wherein the dummy pattern is disposed between the adjacent data lines of the adjacent pixel regions and covers a portion of upper surfaces of the data lines.

18. An electro-luminescent display device, comprising:
- a light shielding layer on a substrate;
- a data line disposed in a first direction on the substrate;
- a first insulating layer disposed on the data line;
- an active layer disposed on the first insulating layer;
- a gate line disposed above the first insulating layer in a second direction vertically crossing the first direction and defining a pixel region with the data line, wherein the gate line, the data line and the light shielding layer are disposed on a same plane of the substrate;
- a second insulating layer disposed on the gate line;
- a gate electrode disposed on the second insulating layer;
- a third insulating layer disposed on the gate electrode and the gate line;
- a source electrode and a drain electrode disposed on the third insulating layer and electrically connected to the active layer; and
- a contact hole disposed between adjacent data lines of adjacent pixel regions and electrically connecting the source electrode and the data line, wherein the contact hole has an area greater than a contact area between the source electrode and the data line.

19. The electro-luminescent display device according to claim 18, further comprising a dummy pattern provided between the data lines of the adjacent pixel regions and including the active layer of a semiconductor layer and the first insulating layer.

20. The electro-luminescent display device according to claim 19, wherein the dummy pattern includes a first dummy pattern of the semiconductor layer and a second dummy pattern of the first insulating layer under the first dummy pattern.

21. The electro-luminescent display device according to claim 20, wherein the first dummy pattern functions as an etch-stop layer that prevents the second dummy pattern from being etched.

22. The electro-luminescent display device according to claim 20, wherein the first dummy pattern has a same or greater width than the second source electrode.

23. The electro-luminescent display device of claim 18, wherein the dummy pattern is disposed between the data lines and covers partial upper surfaces of the adjacent data lines of the adjacent pixel regions.

* * * * *